United States Patent
Benisty et al.

(10) Patent No.: US 10,372,373 B1
(45) Date of Patent: Aug. 6, 2019

(54) ADAPTIVE POWER BALANCING FOR MEMORY DEVICE OPERATIONS

(71) Applicant: Western Digital Technologies, Inc., San Jose, CA (US)

(72) Inventors: Shay Benisty, Beer Sheva (IL); Yoav Weinberg, Haifa (IL); Ariel Navon, Revava (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/883,071

(22) Filed: Jan. 29, 2018

(51) Int. Cl.
  *G06F 3/06* (2006.01)
  *G11C 16/30* (2006.01)

(52) U.S. Cl.
  CPC .......... *G06F 3/0653* (2013.01); *G06F 3/0625* (2013.01); *G06F 3/0629* (2013.01); *G06F 3/0679* (2013.01); *G11C 16/30* (2013.01)

(58) Field of Classification Search
  CPC .............................. G06F 3/0625; G11C 16/30
  See application file for complete search history.

(56) References Cited

U.S. PATENT DOCUMENTS

| | | | | |
|---|---|---|---|---|
| 8,902,662 | B2* | 12/2014 | Shiga | G11C 16/30 365/185.18 |
| 9,658,790 | B2* | 5/2017 | Erez | G06F 3/0625 |
| 2012/0221880 | A1* | 8/2012 | Kim | G06F 1/3225 713/400 |
| 2016/0116968 | A1* | 4/2016 | Thangaraj | G06F 1/3268 713/320 |
| 2017/0228187 | A1* | 8/2017 | Hoshino | G06F 3/0625 |

* cited by examiner

*Primary Examiner* — Vanthu T Nguyen
(74) *Attorney, Agent, or Firm* — Kunzler Bean & Adamson, PC

(57) ABSTRACT

Apparatus, systems, methods, and computer program products for adaptive power balancing in memory device operations are disclosed. One apparatus includes a power balancing component for the memory device. A power balancing component is configured to determine a first amount of power consumed by each respective operation in a set of operations for a memory device for at least one previous iteration of each respective operation. A power balancing component utilizes a second amount of power to perform a next iteration of each respective operation based on a first amount of power consumed by each respective operation in at least one previous iteration.

20 Claims, 19 Drawing Sheets

ADAPTIVE POWER BALANCING FOR MEMORY DEVICE OPERATIONS

TECHNICAL FIELD

The present disclosure, in various embodiments, relates to memory devices and more particularly relates to adaptive power balancing for memory device operations.

BACKGROUND

Conventional computing systems often utilize a controller to manage operations for a memory device. The controller may be responsible for interaction with a memory device, which may include a variety of operations. That is, the controller may be designed to perform operations (e.g., low-level operations) on a memory device.

Typically, each low-level operation performed on a memory device consumes power. The amount of power consumed by each particular operation may depend on the type of operation and/or the quality of the memory device. Further, the amount of power consumed by a particular memory device may change during the lifetime of the memory device.

SUMMARY

Apparatuses, systems, methods, and computer program products for adaptive power balancing of memory device operations are disclosed. In one embodiment, an apparatus includes a memory device and a power balancing component for the memory device. A power balancing component, in certain embodiments, is configured to determine a first amount of power consumed by each respective operation in a set of operations for a memory device for at least one previous iteration of each respective operation. In a further embodiment, a power balancing component is configured to utilize a second amount of power to perform a next iteration of each respective operation based on a first amount of power consumed by each respective operation in at least one previous iteration.

A method, in one embodiment, includes determining, by a controller, a first amount of power consumed by each respective operation in a set of operations for each memory device in a set of one or more memory devices for at least one previous iteration of each respective operation. In a further embodiment, a method includes utilizing a second amount of power to perform a next iteration of each respective operation based on a first amount of power consumed by each respective operation in at least one previous iteration.

An apparatus, in certain embodiments, includes a plurality of memory elements. In one embodiment, an apparatus includes means for monitoring amounts of electrical power used for execution of each of a plurality of operations on different memory elements of a plurality of memory elements. An apparatus, in a further embodiment, includes means for adjusting subsequent execution of one or more operations of a plurality of operations based on monitored amounts of power to fit within power budgets for different memory elements of a plurality of memory elements.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
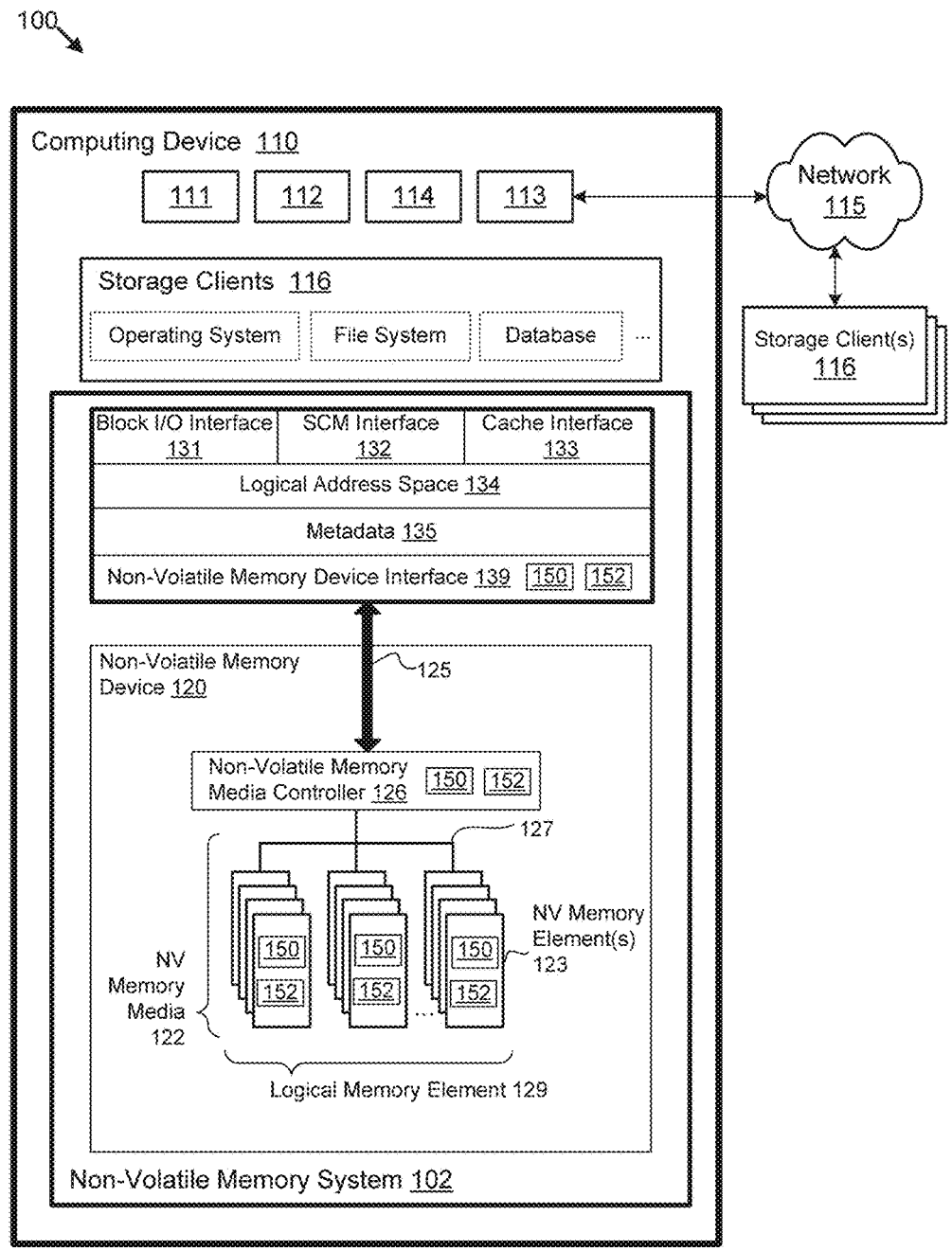
FIG. 1A is a schematic block diagram illustrating one embodiment of a system providing adaptive power balancing for operations in a memory device.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer-readable storage media storing computer-readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer-readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

In addition, as used herein, the term "set" can mean "one or more," unless expressly specified otherwise. The term "sets" can mean multiples of or a plurality of "one or mores," "ones or more," and/or "ones or mores" consistent with set theory, unless expressly specified otherwise.

Aspects of the present disclosure are described with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 comprising a Power Balancing Component (PBC) 150 and one or more power consumption tables 152 (also simply referred to individually, in various groups, or collectively, as power consumption table(s) 152) for a controller 126 of a non-volatile memory device 120. The PBC 150 and/or power consumption table(s) 152 may be part of and/or in communication with a controller 126, a non-volatile memory element 123, a device driver, or the like. The PBC 150 and/or power consumption table(s) 152 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer-readable storage medium 114. The computer-readable storage medium 114 may comprise executable instructions configured to cause the computing device 110 (e.g., processor 111) to perform steps of one or more of the methods disclosed herein. Alternatively, or in addition, the PBC 150 may be embodied as one or more computer-readable instructions stored on the non-transitory storage medium 114.

In certain computing systems or devices, a controller 126 may be configured during an initialization phase with the typical and/or estimated power consumption parameters for each operation that will be performed on a memory device 120. The typical and/or estimated power consumption parameters may be optimized for the period of time when the memory device 120 is new and/or is operating consistent with the typical and/or estimated power consumption parameters. Further, power may be allocated for each operation and the bus performance in the memory device 120 may be optimized based on the initialization values while ensuring that the computing system does not exceed a maximum allowed amount of power for any particular operation (e.g., a power budget for a memory die, memory array, memory device 120, or the like).

One challenge that may be experienced in certain computing systems is that one or more, and sometimes most, of the power parameters for the low-level operations change during the life of the memory device 120. However, the controller 126 for the memory device may be configured to operate over its lifetime using the initialized typical and/or estimated power consumption parameters for each operation. That is, as the actual power consumption parameters for the various operations change during the life of the memory device 120, the controller 126 may tend to work less efficiently with the memory device 120. Specifically, the amount of power allocated to perform a particular operation (e.g., a power budget) may become inaccurate and/or outdated. Further, the inaccurate and/or outdated amount of power may exceed the maximum amount of allowed power for the operation(s) and/or may introduce an unnecessary delay in performing the operation(s). Accordingly, as a memory device 120 in a conventional computing system ages, the interaction between the controller 126 and the memory device 120 may become less efficient than it otherwise could be. In other words, the interaction between the controller 126 and the memory device 120 tends to become less efficient over time in conventional computing systems.

The non-volatile memory system 102, in some embodiments, includes a PBC 150, to overcome one or more of the challenges described above. The PBC 150, in one embodiment, is configured to adaptively balance one or more amounts of power for operations in one or more memory devices performed by a controller, as described elsewhere herein. The PBC 150, in certain embodiments, may determine a first amount of power consumed by each respective operation in a set of operations for the memory device(s) for at least one previous iteration of each respective operation and utilize a second amount of power to perform a next iteration of each respective operation based on the first amount of power consumed by each respective operation in the at least one previous iteration.

The set of operations for the memory device(s) may include a single operation (e.g., a low-level operation) or a plurality of operations (e.g., a plurality of low-level operations). Further, a first memory device may include a single operation and a second memory device may include a plurality of operations.

In further embodiments, the PBC 150 may determine a third amount of power utilized to perform the at least one previous iteration of each respective operation and compare the third amount of power and the first amount of power. Here, the third amount of power and the second amount of power are equal amounts of power in response to determining that the third amount of power is equal to the first amount of power and/or the second amount of power is greater than the third amount of power in response to determining that the third amount of power is less than the first amount of power.

In some embodiments, the PBC 150 may monitor each respective operation over a predetermined amount of time including at least two previous iterations of each respective operation, track the first amount of power consumed by each respective operation during the predetermined amount of time, calculate an average first amount of power consumed by the at least two previous iterations of each respective operation during the predetermined amount of time, and set the second amount of power equal to the average first amount of power. In other embodiments, the PBC 150 may track a plurality of the first amounts of power consumed by each respective operation over a predetermined amount of time including a plurality of previous iterations of each respective operation, generate a predicted first amount of power that will be consumed by each respective operation in the next iteration of each respective operation based on the tracked first amount of power, and set the second amount of power equal to the predicted first amount of power. Thus, the PBC 150 may provide adaptive power balancing for memory device operations by a controller.

The non-volatile memory system 102, in additional or alternative embodiments, includes the power consumption table(s) 152. A power consumption table 152 may be configured to store a representation of the amount of power consumed by the operations (e.g., low-level operations) performed on a memory device, as discussed elsewhere herein. In various embodiments, a power consumption table 152 may store a representation of the amount(s) of power consumed by each operation (e.g., one or more low-level operations) performed on a memory device. In additional or alternative embodiments, a power consumption table 152 may store a representation of the amount(s) of power consumed by each operation (e.g., one or more low-level operations) performed on two or more memory devices.

The amount(s) of power consumed by each operation represented in a power consumption table 152, in some embodiments, may include the amount of power consumed by the operation(s) in one or more previous iterations or performances of the operation(s). In additional or alternative embodiments, the amount(s) of power consumed by each operation represented in a power consumption table 152 may include an average of the amount of power consumed by the operation(s) in two or more previous iterations or performances of the operation(s). In further additional and/or alternative embodiments, the amount(s) of power consumed by each operation represented in a power consumption table 152 may include the median and/or mode (e.g., an average) of the amount of power consumed by the operation(s) in two or more previous iterations or performances of the operation(s) (e.g., in a sliding window, or the like).

In various embodiments, the PBC 150 and/or power consumption table(s) 152 may comprise logic hardware of one or more non-volatile memory devices 120, such as a controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In other embodiments, the PBC 150 and/or power consumption table(s) 152 may comprise executable software code, such as a device driver or the like, stored on the computer-readable storage medium 114 for execution on the processor 111. In further embodiments, the PBC 150 and/or power consumption table(s) 152 may include a combination of both executable software code and logic hardware.

In various embodiments, the PBC 150 and/or power consumption table(s) 152 is/are configured to receive I/O requests from a device driver or other executable application via a bus 125 or the like. The PBC 150 and/or power consumption table(s) 152 may be further configured to transfer data to/from a device driver and/or storage clients 116 via the bus 125. Accordingly, the PBC 150 and/or power consumption table(s) 152, in various embodiments, may comprise and/or be in communication with one or more direct memory access (DMA) modules, remote DMA modules, bus controllers, bridges, buffers, and so on to facilitate the transfer of storage requests and associated data. In other embodiments, the PBC 150 and/or power consumption table(s) 152 may receive storage requests as an API call from a storage client 116, as an IO-CTL command, or the like.

According to various embodiments, a controller 126 in communication with one or more PBCs 150 and/or one or more power consumption tables 152 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A controller 126 may be configured to manage data operations on the non-volatile memory media 122, and may comprise one or more processors, programmable processors (e.g., FPGAs), ASICs, micro-controllers, or the like. In some embodiments, the controller 126 is configured to store data on and/or read data from the non-volatile memory media 122, to transfer data to/from the non-volatile memory device 120, and so on.

The controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . WLN).

The controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102. A device driver may further comprise a non-volatile memory device interface 139 that is configured to transfer data, commands, and/or queries to the controller 126 over a bus 125, as described above.

Figure 1B:
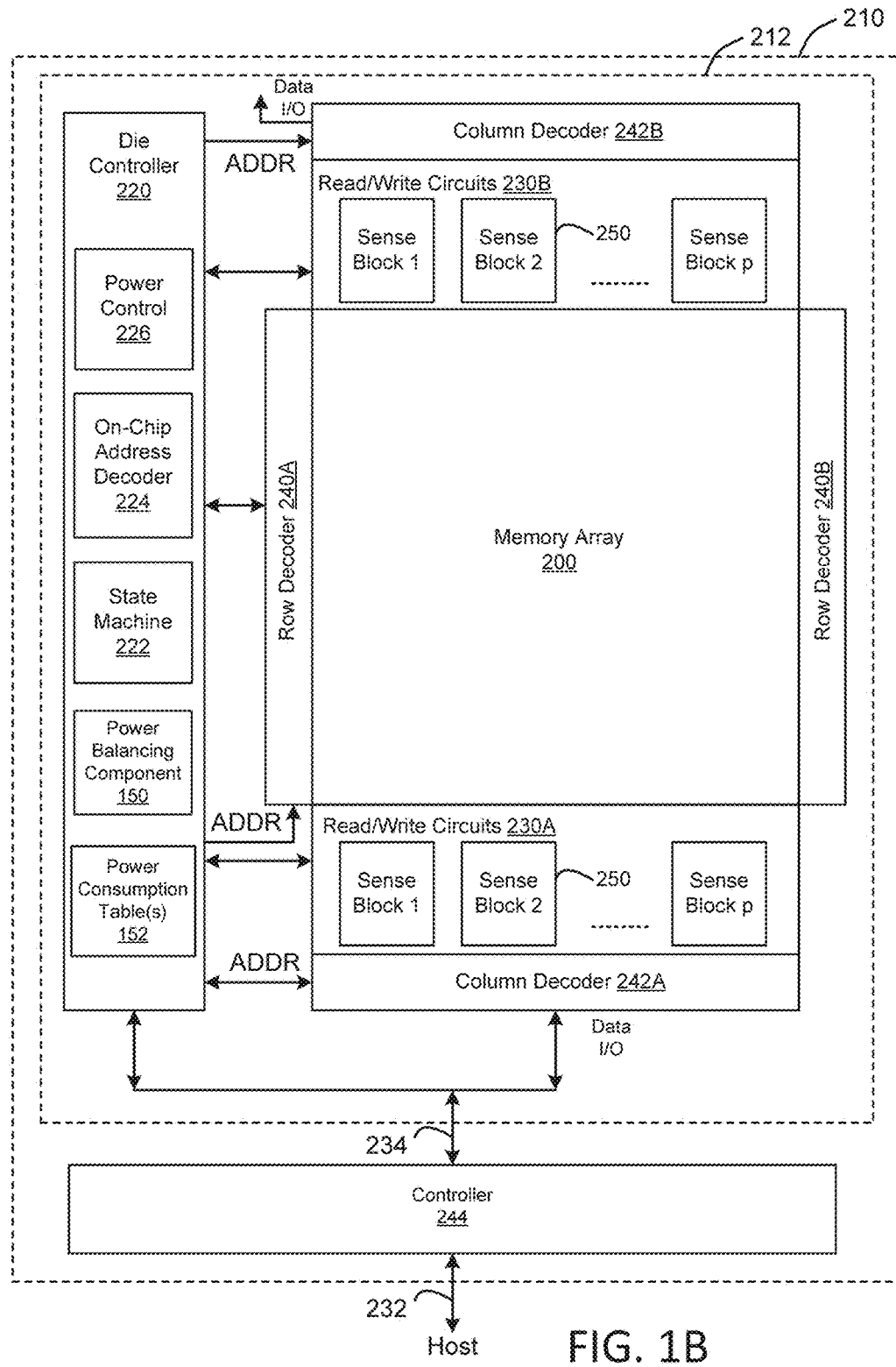
FIG. 1B is a schematic block diagram illustrating another embodiment of a system providing adaptive power balancing for operations in a memory device.

FIG. 1B illustrates an embodiment of a non-volatile storage device 210 that may include one or more memory die or chips 212. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation may include multiple chips 212.

Die controller 220, in one embodiment, cooperates with the read/write circuits 230A/230B to perform memory operations on the memory array 200. The die controller 220, in various embodiments, includes a PBC 150 and/or a power consumption table 152, a state machine 222, and an on-chip address decoder 224. In one embodiment, the state machine 222 comprises at least a portion of the PBC 150 and/or at least a portion of one or more power consumption tables 152. In further embodiments, the controller 244 comprises at least a portion of the PBC 150 and/or at least a portion of one or more power consumption tables 152. In various embodiments, one or more of the sense blocks 250 comprises at least a portion of the PBC 150 and/or at least a portion of one or more power consumption tables 152.

The state machine 222, in one embodiment, provides chip-level control of memory operations. The on-chip address decoder 224 provides an address interface to convert between the address that is used by the host or a memory controller to the hardware address used by the decoders 240A, 240B, 242A, and 242B. In certain embodiments, the state machine 222 includes an embodiment of the PBC 150 and/or an embodiment of one or more power consumption table 152.

The PBC 150 and/or the power consumption table(s) 152, in certain embodiments, is/are embodied as software in a device driver, hardware in a controller 244, and/or hardware in a die controller 220 and/or state machine 222. In various embodiments, one or any combination of die controller 220, PBC 150, decoder circuit 224, state machine circuit 222, decoder circuit 242A, decoder circuit 242B, decoder circuit 240A, decoder circuit 240B, read/write circuits 230A, read/write circuits 230B, and/or controller 244 may be referred to as one or more managing circuits.

Figure 2:
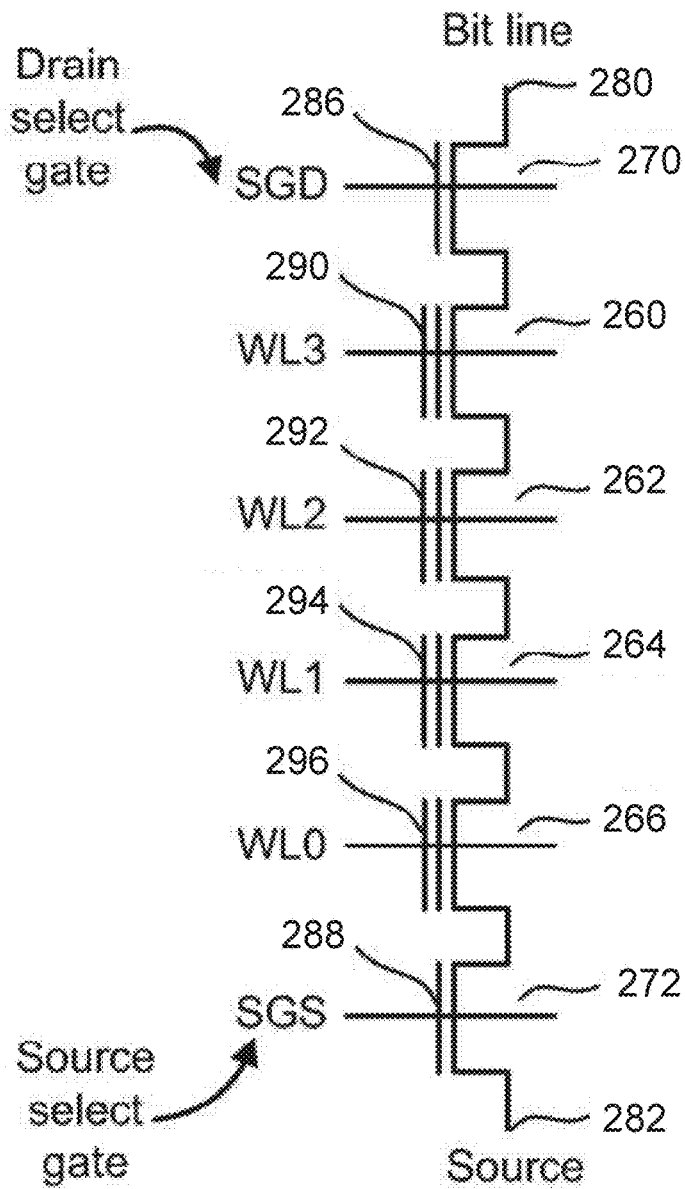
FIG. 2 is a schematic block diagram illustrating one embodiment of a string of storage cells.

FIG. 2 depicts one embodiment of a NAND string comprising a plurality of storage elements. The NAND string depicted in FIG. 2, in some embodiments, includes four transistors 260, 262, 264, and 266 connected in series and located between a first select transistor 270 and a second select transistor 272. In some embodiments, a transistor 260, 262, 264, and 266 includes a control gate and a floating gate. A control gate 290, 292, 294, 2 and 96, in one embodiment, is connected to, or comprises a portion of, a word line. In a further embodiment, a transistor 260, 262, 264, and 266 is a storage element, storage cell, or the like, also referred to as a memory cell. In some embodiments, a storage element may include multiple transistors 260, 262, 264, and 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/storage cell 260, 262, 264, and 266 in the NAND string. The NAND string, in some embodiments, may include some storage elements 260, 262, 264, and 266 that have been programmed and some storage elements 260, 262, 264, and 266 that have not been programmed. As described in more detail below, the PBC 150 and/or power consumption table 152 controls whether portions of a storage device, such as a NAND string, are used for GC operations and/or folding operations, respectively.

Figure 3:
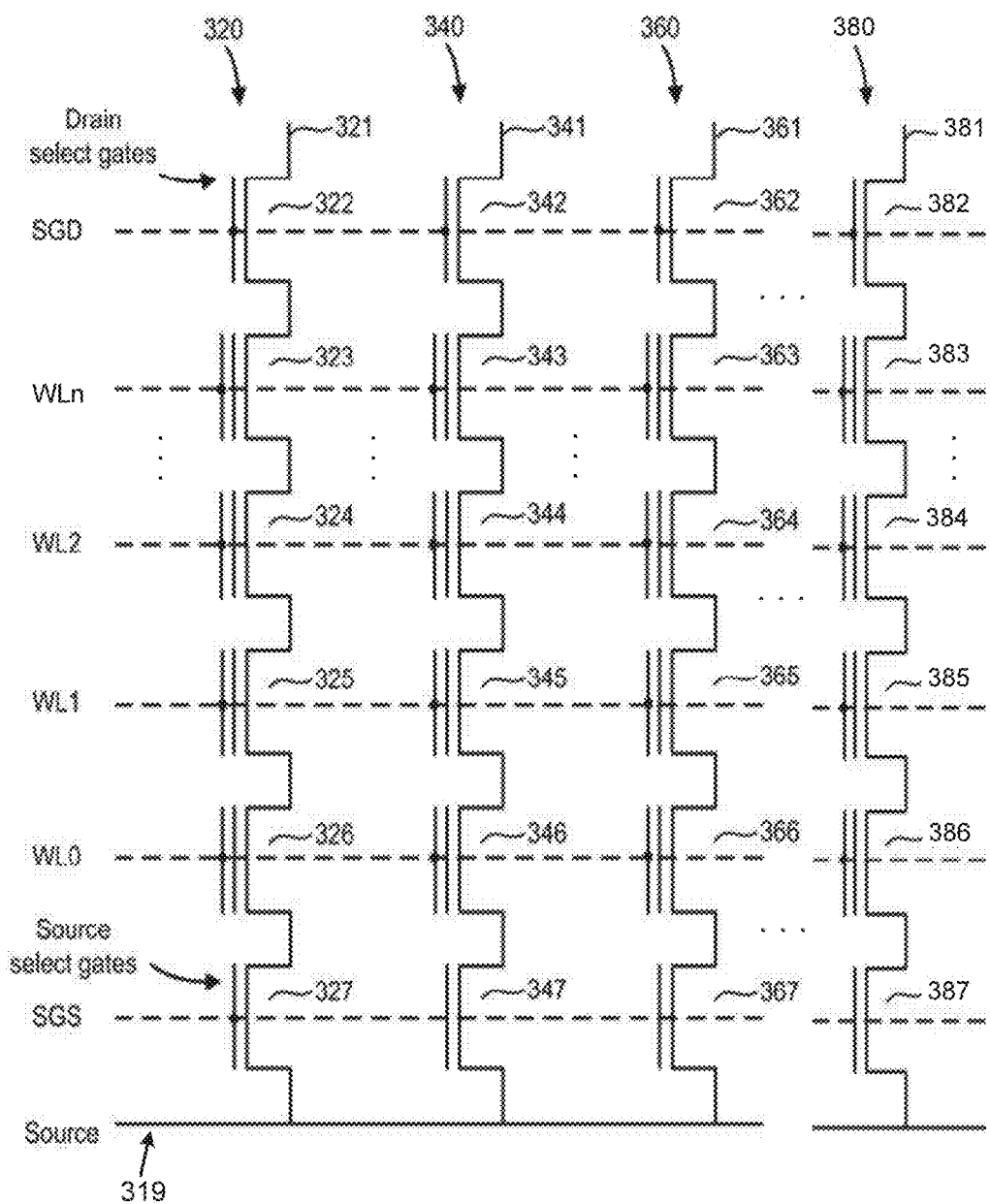
FIG. 3 is a schematic block diagram illustrating one embodiment of an array of storage cells.

FIG. 3 is a circuit diagram depicting a plurality of NAND strings 320, 340, 360, and 380. The architecture for a flash memory system using a NAND structure may include several NAND strings 320, 340, 360, and 380. For example, FIG. 3 illustrates NAND strings 320, 340, 360, and 380 in a memory array 200 that includes multiple NAND strings 320, 340, 360, and 380. In the depicted embodiment, each NAND string 320, 340, 360, and 380 includes drain select transistors 322, 342, 362, and 382, source select transistors 327, 347, 367, and 387, and storage elements 323-326, 343-346, 363-366, and 383-386. While four storage elements 323-326, 343-346, 363-366, and 383-386 per NAND string 320, 340, 360, and 380 are illustrated for simplicity, some NAND strings 320, 340, 360, and 380 may include any number of storage elements, e.g., thirty-two, sixty-four, or the like storage elements.

NAND strings 320, 340, 360, and 380, in one embodiment, are connected to a source line 319 by source select transistors 327, 347, 367, 387. A selection line SGS may be used to control the source side select transistors. The various NAND strings 320, 340, 360, and 380, in one embodiment, are connected to bit lines 321, 341, 361, 381 by drain select transistors 322, 342, 362, and 382. The drain select transistors 322, 342, 362, and 382 may be controlled by a drain select line SGD. In some embodiments, the select lines do not necessarily need to be in common among the NAND strings 320, 340, 360, and 380; that is, different select lines may be provided for different NAND strings 320, 340, 360, and 380.

As described above, each word line WL0-WLn comprises one or more storage elements 323-383, 324-384, 325-385, and 326-386. In the depicted embodiment, each bit line 321, 341, 361, 381 and the respective NAND string 320, 340, 360, and 380 comprise the columns of the memory array 200, storage block, erase block, or the like. The word lines WL0-WLn, in some embodiments, comprise the rows of the memory array 200, storage block, erase block, or the like. Each word line WL0-WLn, in some embodiments, connects the control gates of each storage element 323-383, 324-384, 325-385, and 326-386 in a row. Alternatively, the control gates may be provided by the word lines WL0-WLn themselves. In some embodiments, a word line WL0-WLn may include tens, hundreds, thousands, millions, or the like of storage elements 323-383, 324-384, 325-385, and 326-386.

In one embodiment, each storage element 323-326, 343-346, 363-366, and 383-386 is configured to store data. For example, when storing one bit of digital data, the range of possible threshold voltages ("VTH") of each storage element 323-326, 343-346, 363-366, and 383-386 may be divided into two ranges which are assigned logical data "1" and "0." In one example of a NAND type flash memory, the VTH may be negative after the storage elements 323-326, 343-346, 363-366, and 383-386 are erased, and defined as logic "1." In one embodiment, the VTH after a program operation is positive and defined as logic "0."

When the VTH is negative and a read is attempted, in some embodiments, storage elements 323-326, 343-346, 363-366, and 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, and 326-386 may also store multiple levels of information, for example, multiple bits of digital data. In such an embodiment, the range of VTH value is divided into the number of levels of data. For example, if four levels of information may be stored in each storage element 323-326, 343-346, 363-366, and 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, and 383-386 and the threshold voltage ranges of the storage elements 323-326, 343-346, 363-366, and 383-386 depends upon the data encoding scheme adopted for the storage elements 323-326, 343-346, 363-366, and 383-386.

In some embodiments, portions of the storage elements 323-326, 343-346, 363-366, and 383-386 may be defective. In such an embodiment, the PBC 150 and/or power consumption table 152 may manage which portions of the storage elements 323-326, 343-346, 363-366, and 383-386 are used for GC operations and/or folding operations, respectively.

Figure 4:
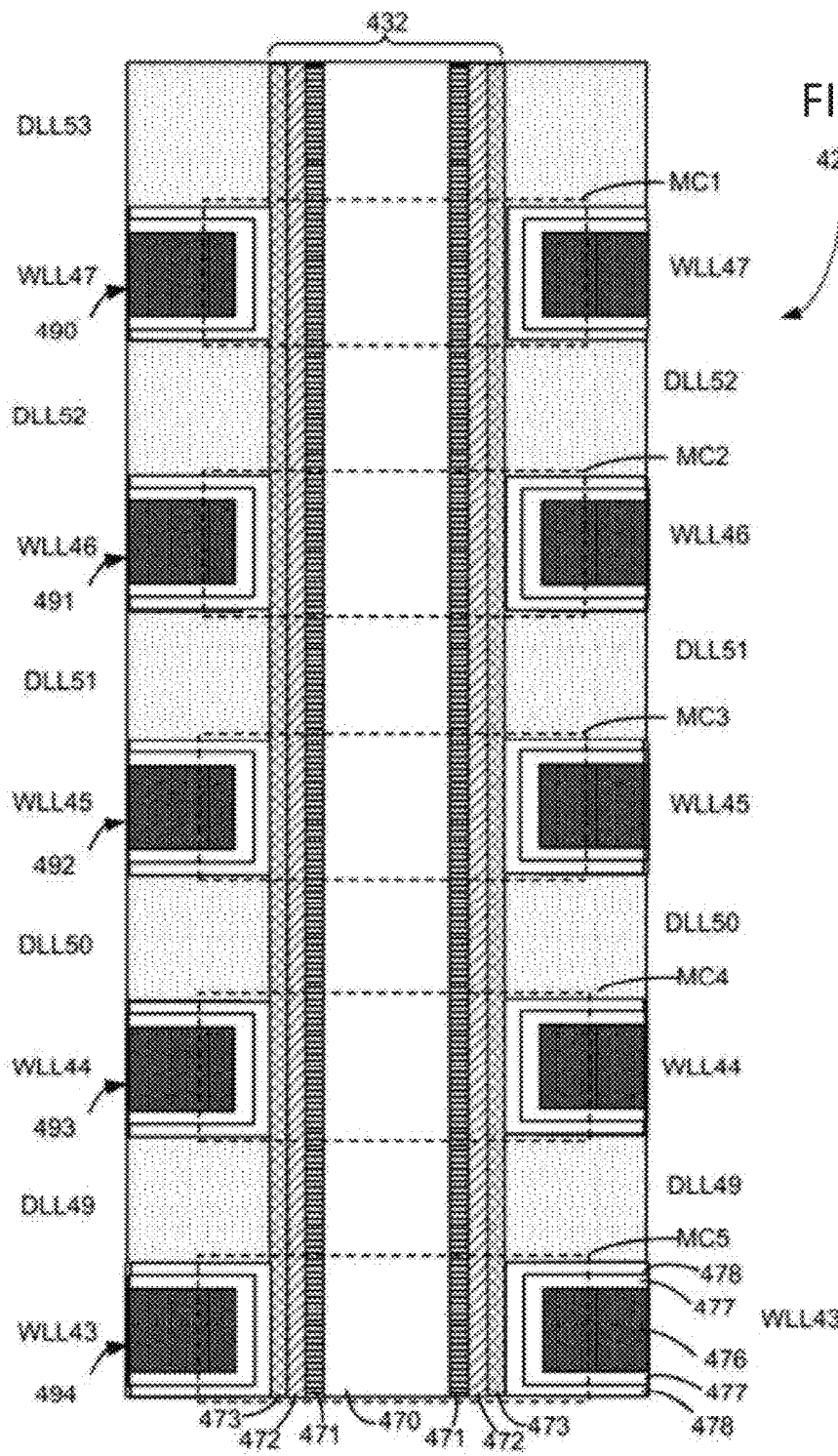
FIG. 4 is a schematic block diagram illustrating one embodiment of a three-dimensional (3-D), vertical NAND flash memory structure.

FIG. 4 illustrates one embodiment of a cross-sectional view of a 3D, vertical NAND flash memory structure 429 or string 429. In one embodiment, the vertical column 432 is round and includes four layers; however, in other embodiments more or less than four layers may be included and other shapes may be used (e.g., a "U" shape instead of an "I" shape or the like). In one embodiment, a vertical column 432 includes an inner core layer 470 that is made of a dielectric, such as SiO2. Other materials may also be used. Surrounding inner core 470 is polysilicon channel 471. Materials other than polysilicon may also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge-trapping layer 473, such as (for example) Silicon Nitride. Other materials and structures may also be used. The technology described herein is not limited to any particular material or structure.

FIG. 4 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge-trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties.

Furthermore, the materials used are not limited to silicon dioxide (SiO2) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge-trapping layer 473 that is associated with the memory cell. These electrons are drawn into the charge-trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 429 (e.g., different NAND strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 5:
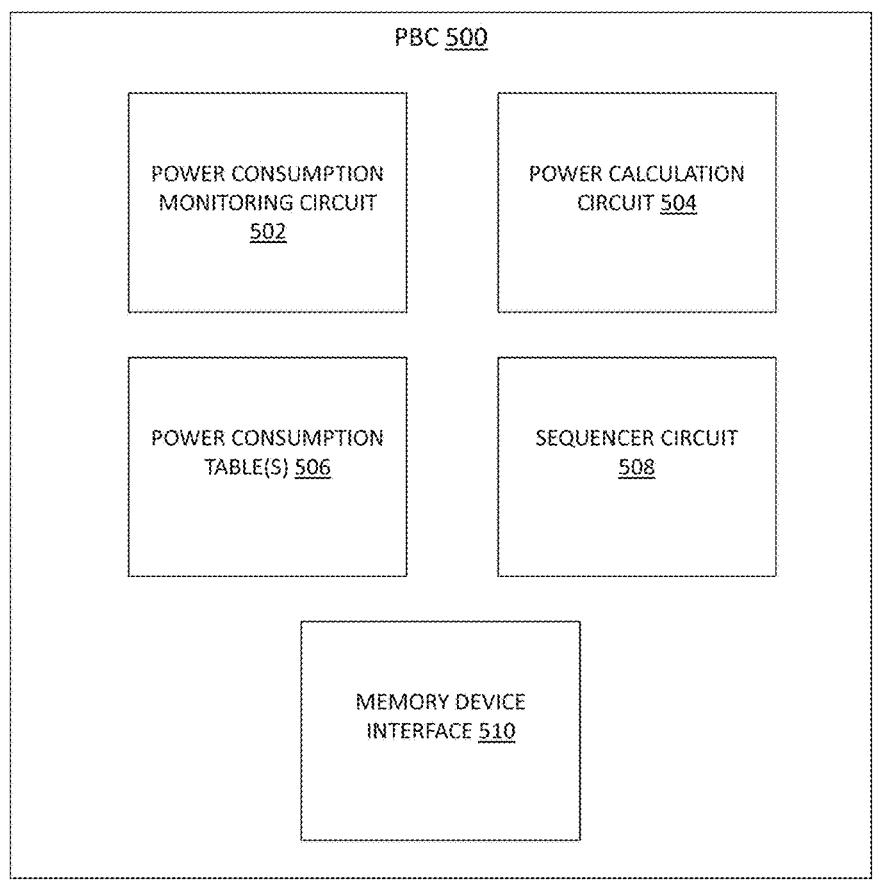
FIG. 5 is a schematic block diagram illustrating one embodiment of a power balancing component (PBC) included in the system of FIG. 1A and/or FIG. 1B.

With reference to FIG. 5, FIG. 5 is a block diagram of one embodiment of a PBC 500. At least in the illustrated embodiment, the PBC 500 includes, among other components, a power consumption monitoring circuit 502, a power calculation circuit 504, one or more power consumption tables 506, a sequencer circuit 508, and a memory device interface (I/F) 510.

Figure 8A:
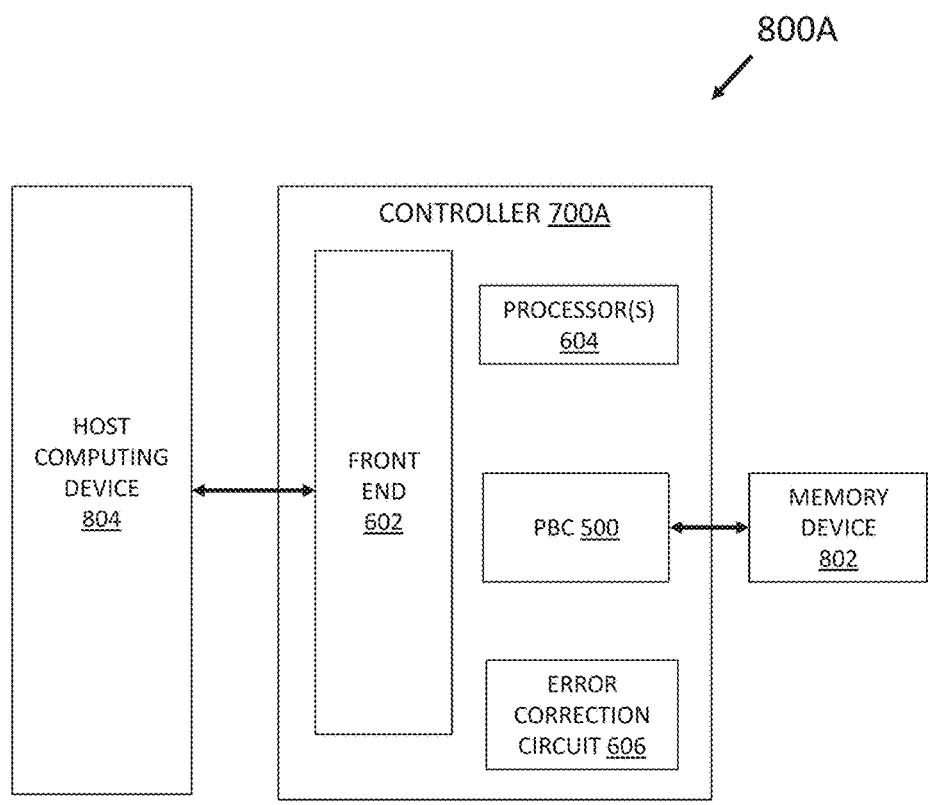
FIGS. 8A and 8B are schematic block diagrams illustrating various embodiments of a storage system including the controller(s) of FIGS. 1A, 1B, 7A, and/or 7B coupled to and/or in communication with a set of memory devices.
Figure 8B:
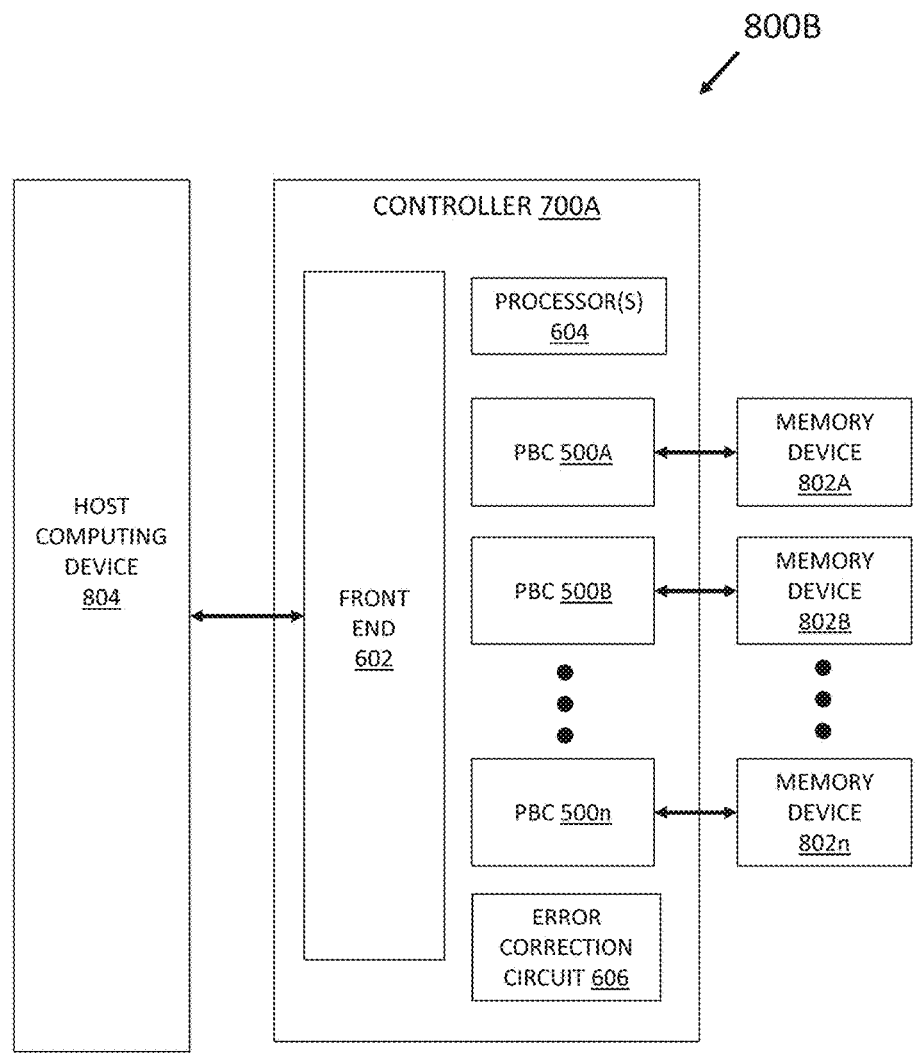

A power consumption monitoring circuit 502 may include any suitable hardware that may determine, monitor, measure, and/or detect the amount of power consumed by one or more input/output (I/O) operations performed on a memory device (see e.g., memory device(s) 802 in FIGS. 8A and 8B). In some embodiments, a consumption monitoring circuit 502 may monitor and/or detect the amount of power consumed by one or more low-level operations performed on the memory device (e.g., based on a measured and/or otherwise determined voltage and/or current over time at one or more locations in a memory array of an integrated circuit memory die, and/or another memory device). In additional or alternative embodiments, a power consumption monitoring circuit 502 may record and/or write the determined/detected amount(s) of power actually consumed by one or more low-level operations in one or more power consumption tables 506.

Example low-level operations for which the amount of power consumed may be determined and/or detected include, but are not limited to, issuing commands to a memory device (e.g., an integrated circuit memory die or the like), issuing addresses to the memory device (e.g., an integrated circuit memory die or the like), issuing parametric data to the memory device (e.g., an integrated circuit memory die or the like), collecting status data from the memory device (e.g., an integrated circuit memory die or the like), and/or transferring data to/from the memory device (e.g., write operations, sense operations (e.g., read operations, program verify operation, or the like), block erase operations, or the like), among other low-level operations that are possible and contemplated herein. The determined and/or detected amount(s) of power may be stored in one or more power consumption tables 506, as discussed elsewhere herein.

A power calculation circuit 504 may include any suitable hardware and/or software that may provide and/or determine the amount of power to utilize in the next iteration of one or more I/O operations performed on a memory device (e.g., a memory device). The one or more I/O operations may include the one or more low-level operations discussed elsewhere herein, among other possible I/O operations.

In various embodiments, the amount of power utilized for the next iteration of a low-level operation may be based on the amount of power consumed by the low-level operation in one or more previous iterations of each low-level operation. That is, a power calculation circuit 504 may provide and/or determine an amount of power to use (e.g., that is likely to be used) in the next iteration of each respective low-level operation based on one or more amounts of power consumed by each respective low-level operation in one or more previous iterations. In certain embodiments, the power calculation circuit 504 schedules execution of operations in the next iteration of one or more low-level operations (e.g., one or more subsequent read operations, subsequent write/program operations, and/or subsequent erase operations) to fit within a power budget (e.g., by delaying and/or otherwise rescheduling execution of one or more operations such that an amount of power used at a given time satisfies a power budget). A power budget may be associated with a memory device, with an integrated circuit memory die or other memory element (e.g., such that a memory device comprises a plurality of different power budgets for different memory die or other memory elements), with a die plane, with a memory array, or the like. In one embodiment, a power budget comprises a maximum and/or peak amount of electrical power that may be used at a given time, for one or more operations, or the like.

Figure 6A:
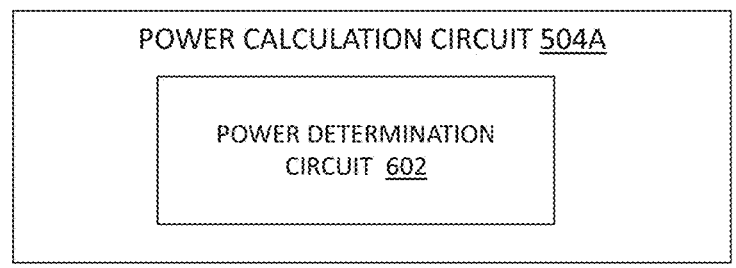
FIGS. 6A through 6D are a schematic block diagrams illustrating various embodiments of a power calculation circuit included in the PBC of FIG. 5.

With reference to FIGS. 6A through 6D, FIGS. 6A through 6D illustrate embodiments of power calculation circuits 504A, 504B, 504C, and 504D (also simply referred to individually, in various groups, or collectively, as power calculation circuit(s) 504). In FIG. 6A, power calculation circuit 504A includes, among other components, a power determination circuit 602, which may include any suitable hardware and/or software that may provide and/or determine the amount of power to utilize in the next iteration of each low-level operation (e.g., to fit within a power budget) based on the amount of power consumed in the immediately preceding iteration. In some embodiments, the amount of power that the power determination circuit 602 provides and/or determines for use in the next iteration of each respective low-level operation is equal to the amount of power consumed by each respective low-level operation in the immediately preceding iteration of each respective low-level operation, but may be delayed or spread out over a greater amount of time by delaying execution of and/or rescheduling one or more operations, to fit within a power budget (e.g., a maximum, instantaneous, and/or peak amount of power, or the like).

For example, the amount of power provided/determined by the power determination circuit 602 for the next iteration of a command issuing addresses to a memory device may be the same amount of power that the previous command issuing addresses to the memory device consumed in the previous iteration, but the timing and/or scheduling may be adjusted based on a power budget, or the like. Likewise, the amount of power provided/determined by the power determination circuit 602 for the next iteration of a command issuing parametric data (e.g., a different command than the command issuing the addresses) to the memory device may be the same amount of power that the previous command issuing parametric data to the memory device consumed in the previous iteration, but the timing and/or scheduling may be adjusted based on a power budget, or the like. Here, the amounts of power provided and/or determined by the power determination circuit 602 for the two different types commands in these examples may be the same amount of power or different amounts of power, but may be provided/determined independent of one another since they are based on the previous iteration of each respective command.

Figure 6B:
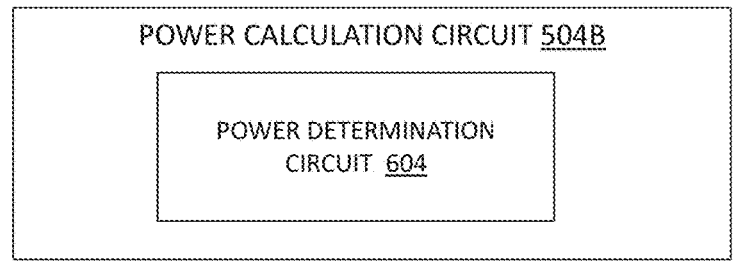

In FIG. 6B, a power calculation circuit 504B includes, among other components, a power determination circuit 604, which may include any suitable hardware and/or software that may provide and/or determine the amount of power to utilize in the next iteration of each low-level operation based on the respective amounts of power consumed in two or more previous iterations (e.g., to fit within a power budget, or the like). In some embodiments, the amounts of power that the power determination circuit 604 provides and/or determines for use in the next iteration of each respective low-level operation based on the amounts of power consumed by each respective low-level operation in two or more iterations of each respective low-level operation. That is, each respective low-level operation may include its own calculated amount of power for use in performing its next iteration.

Various embodiments of a power determination circuit 604 may calculate one or more average (e.g., mean) values, median values, and/or mode values for a set of previous iterations of a low-level operation in providing and/or determining the amount of power to utilize in the next iteration of each low-level operation. In some embodiments, the amount of power utilized for the next iteration of a low-level operation may be the average of the amounts of power consumed by the low-level operation in two or more previous iterations of the low-level operation, and may be adjusted by delaying execution of the low-level operation and/or a portion thereof, such that the amount of power utilized for a plurality of concurrently executing operations satisfies a power budget, or the like. In additional or alternative embodiments, the amount of power utilized for the next iteration of a low-level operation may be the median value of the amounts of power consumed by the low-level operation in two or more previous iterations of the low-level operation, and may be adjusted by delaying execution of the low-level operation and/or a portion thereof, such that the amount of power utilized for a plurality of concurrently executing operations satisfies a power budget, or the like. In further additional or alternative embodiments, the amount of power utilized for the next iteration of a low-level operation may be the mode value of the amounts of power consumed by the low-level operation in three or more previous iterations of the low-level operation, and may be adjusted by delaying execution of the low-level operation and/or a portion thereof, such that the amount of power utilized for a plurality of concurrently executing operations satisfies a power budget, or the like.

In additional or alternative embodiments, the amount of power utilized for the next iteration of a low-level operation may be the average value of two or more average values, two or more median values, or two or more mode values. In further additional or alternative embodiments, the amount of power utilized for the next iteration of a low-level operation may be the average value of two or more of one or more average values, one or more median values, and one or more mode values.

In some additional or alternative embodiments, the amount of power utilized for the next iteration of a low-level operation may be the median value of two or more average values, two or more median values, or two or more mode values. In some further additional or alternative embodiments, the amount of power utilized for the next iteration of a low-level operation may be the median value of two or more of one or more average values, one or more median values, and one or more mode values.

In other additional or alternative embodiments, the amount of power utilized for the next iteration of a low-level operation may be the mode value of three or more average values, three or more median values, or three or more mode values. In further additional or alternative embodiments, the amount of power utilized for the next iteration of a low-level operation may be the mode value of three or more of one or more average values, one or more median values, and one or more mode values.

Further, various embodiments of the power determination circuit 604 may provide and/or determine the amount of power to utilize in the next iteration of different low-level operations using the same or different calculations and/or techniques. For example, a power determination circuit 604 may use the average, median, or mode value in providing and/or determining the amount of power to utilize in the next iteration of each different low-level operation. In another non-limiting example, the power determination circuit 604 may use the average value in providing and/or determining the amount of power to utilize in the next iteration of one or more low-level operations and the median value in providing and/or determining the amount of power to utilize in the next iteration of one or more different types low-level operations, among other combinations of the average value, median value, and/or mode value that are possible and contemplated herein.

In additional or alternative embodiments, the calculation and/or technique utilized to determine the amount of power to utilize in the next iteration of a low-level operation may change over time. The change over time, in various embodiments, may be based on the expiration of a predetermined amount of time and/or the quantity of iterations that are performed for a particular low-level operation. For example, the amount of power to utilize in the next iteration of a low-level operation may be based on the average value during a predetermined amount of time and then changed to the median or mode value upon the expiration of the first predetermined amount of time, among other combinations of the average value, median value, and/or mode value that are possible and contemplated herein. Here, the predetermined amount of time may include an initial period of time (e.g., a period of time when a memory device is considered and/or estimated to be "new" and/or operating properly) or any period and/or amount of time subsequent to the initial period of time.

In a similar non-limiting example, the amount of power to utilize in the next iteration of a low-level operation may be based on the average value during a predetermined quantity of iterations and then changed to the median or mode value upon the performance of the predetermined quantity of iterations, among other combinations of the average value, median value, and/or mode value that are possible and contemplated herein. Further, the predetermined quantity of iterations may be performed during an estimated initial period of time and/or any period of time subsequent thereto.

Figure 6C:
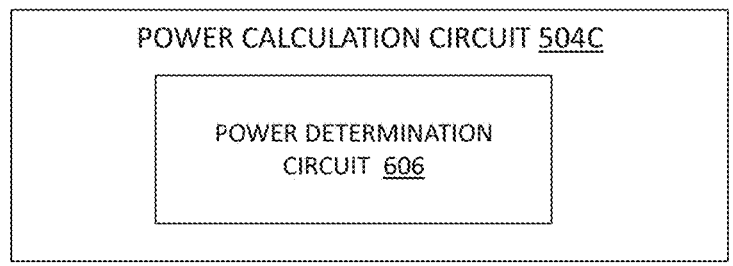

In FIG. 6C, a power calculation circuit 504C includes, among other components, a power determination circuit 606, which may include any suitable hardware and/or software that may estimate and/or predict the amount of power that one or more respective low-level operations will consume in the next iteration. In some embodiments, the estimated and/or predicted amount of power that the power determination circuit 606 provides and/or determines for use in the next iteration of each respective low-level operation is provided/determined based on one or more amounts of power consumed by each respective low-level operation in one or more iterations of each respective low-level operation. That is, each respective low-level operation may include its own estimated and/or predicted amount of power for use in performing its next iteration based on a calculation of one or more of its previous iterations.

In various embodiments, the power determination circuit 606 utilizes machine learning to estimate and/or predict the amount of power that will be used in the next iteration of one or more low-level operations (e.g., each low-level operation) performed on a memory device. The machine learning may include any suitable machine learning circuit, algorithm, technique, module, process, method, and/or operations that is known or developed in the future that may estimate and/or predict the amount of power that will be used in the next iteration of one or more low-level operations (e.g., each low-level operation) performed on a memory device.

The machine learning, in various embodiments, to estimate and/or predict one or more future amounts of consumed power may be based on one or more previous amounts of power consumed by a low-level operation performed on a memory device. That is, the machine learning may estimate and/or predict the amounts of power that one or more low-level operations will consume in the immediately next iteration and/or in one or more iterations that will be performed subsequent to the immediately next iteration.

In some embodiments, the estimation and/or prediction is based on the average amount of power consumed by a low-level operation over one or more predetermined amounts of time and/or for one or more predetermined quantity of iterations of a respective low-level operation. In additional or alternative embodiments, the prediction is based on a power consumption trend, which may be identified and/or learned from the analysis of previous amounts of power consumed during two or more previous iterations of the low-level operation, the average value(s) value consumed over one or more periods of time, the average value(s) consumed during one or more quantities of iterations, and/or combinations thereof, among other suitable metrics that are possible and contemplated herein.

A power determination circuit 606, in various embodiments, may retrieve the actual amount of power consumed by a low-level operation subsequent to providing and/or determining an estimated and/or predicted amount of power. Further, the power determination circuit 606 may compare the actual amount of power consumed and the estimated/predicted amount of power consumption. In response to the actual amount of power consumed and the estimated/predicted amount of power consumption being equal and/or being less than or equal to a predetermined threshold difference amount, the power determination circuit 606 may maintain the value(s) in the power consumption table(s) 506 upon which the estimation and/or prediction was based. In response to the actual amount of power consumed and the estimated/predicted amount of power consumption not being equal and/or being greater than a predetermined threshold difference amount, the power determination circuit 606 may update and/or modify the value(s) in the power consumption table(s) 506 upon which the estimation and/or prediction was based.

Figure 6D:
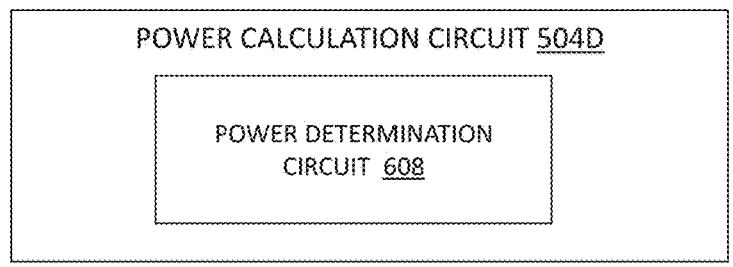

With reference to FIG. 6D, a power calculation circuit 504D includes, among other components, power determination circuit 608, which may include any suitable hardware and/or software that may perform the operations and/or functions of two or more of power determination circuits 602, 604, and 606. That is, the power calculation circuit 506D may perform at least the operations and/or functions of power determination circuits 602 and 604, power determination circuits 602 and 606, power determination circuits 604 and 606, or power determination circuits 602, 604, and 606.

In various embodiments, the power determination circuit 608 may change the amount of power utilized in one or more next iterations of one or more low-level operations using the calculations and/or techniques of power determination circuits 602, 604, and 606 based on the expiration of one or more predetermined amounts time and/or the performance of one or more predetermined quantities of iterations. For example, a power determination circuit 608 may use the average value of the power determination circuits 604 in providing and/or determining the amount of power to utilize in the next iteration of one or more low-level operations and the predicted value in providing and/or determining the amount of power to utilize in the next iteration of one or more different types low-level operations, among other combinations of the calculation(s) and/or functionalities of power determination circuits 602, 604, and 606 that are possible and contemplated herein. In another non-limiting example, the amount of power to utilize in the next iteration of a low-level operation may be based on the previous amount of power (e.g., operations and/or functionality of the power determination circuit 602) for a predetermined quantity of iterations and then changed to the average value (e.g., operations and/or functionality of the power determination circuit 604) upon the performance of the predetermined quantity of iterations, calculation(s) and/or functionalities of power determination circuits 602, 604, and 606 that are possible and contemplated herein.

Yet another non-limiting example includes a combination of the previous two examples. Specifically, a power determination circuit 608 may provide and/or determine the amount of power to use in the next iteration of one or more low-level operations based on the previous amount of power during a first predetermined period of time and/or for a first predetermined quantity of iterations, change to amount(s) of power based on the average value(s) during the first predetermined amount of time, a second predetermined amount of time, the first predetermined quantity of iterations, and/or a second predetermined quantity of iterations, and then change to using estimated and/or predicted values. The estimated and/or predicted values may be based on any suitable combination of one or more periods of time and/or quantities of iterations.

In the various embodiments of the power determination circuits 604, 606, and/or 608, any predetermined period(s) of time may include any single continuous period of time and/or include any two or more discontinuous periods of time. In additional or alternative embodiments of the power determination circuits 604, 606, and/or 608, any predetermined quantity/quantities of iterations may occur during any single continuous period of time and/or during any two or more discontinuous periods of time.

In various embodiments, a power calculation circuit 504 may record and/or write the determined or predicted amount of power allocated for use in a next iteration to a power consumption table 506. In additional or alternative embodiments, a power calculation circuit 504 includes a power consumption table 506 or a copy of the power consumption table 506.

As discussed herein, the determined/detected amount(s) of power and/or estimated/predicted amount(s) of power may be stored in one or more power consumption tables 506. In some embodiments, the power consumption table(s) 506 may be similar to the various embodiments of a power consumption table 152 discussed elsewhere herein (see e.g., FIGS. 1A and 1B).

A power consumption table 506 may include any suitable hardware and/or software that may store data that represents the amount(s) of power consumed in the past and/or may be consumed in the future by one or more operations (e.g., low-level operations) performed on a memory device (e.g., a memory device). That is, a power consumption table 506 may be used to track and/or monitor the actual amount(s) of power consumed by one or more low-level operations.

In various embodiments, a power consumption table 506 may store the amount of power consumed by one or more low-level operations performed on a memory device coupled to and/or in communication with the sequencer circuit 508. For example, a power consumption table 506 may store the amount(s) of power consumed in the past by one or more commands issued by the sequencer circuit 508 to a memory device, as discussed elsewhere herein.

In additional or alternative embodiments, a power consumption table 506 may store the estimated and/or predicted amount of power that will be consumed by the one or more low-level operations performed on a memory device. For example, a power consumption table 506 may store the estimated and/or predicted amount(s) of power that will be consumed by the immediately next iteration and/or a future iteration subsequent to the immediately next iteration of a command issued to a memory device, an address issued to the memory device, parametric data issued to the memory device, status data collected from the memory device, and/or data transferred to/from the memory device (e.g., the amount of power consumed by one or more write operations, one or more sense operations, one or more block erase operations, or the like), among other types of low-level operations that may consume power when performed that are possible and contemplated herein.

In some embodiments, each type of low-level operation includes an associated power consumption table 506. That is, a PBC 500 may include a plurality of power consumption tables 506 to store the amount of power consumed in the past by and/or a future estimated and/or predicted amount of power that will be consumed by a plurality of different low-level operations. In other words, each power consumption table 506 may store data related to its associated low-level operation.

In various embodiments, a power consumption table 506 may store a representation of the past amount(s) of power consumed by its associated low-level operation. For example, each power consumption table 506 may store the amount of power consumed by its associated low-level operation in one or more previous iterations of the low-level operation, the average amount of power consumed by the low-level operation in two or more previous iterations, the median amount of power consumed by the low-level operation in two or more previous iterations, and/or the mode of the amount of power consumed by the low-level operation in two or more previous iterations, or the like, among other suitable amounts of consumed power that are possible and contemplated herein.

In additional or alternative embodiments, a power consumption table 506 may store a representation of an estimated amount of power that its associated low-level operation will consume in one or more future iterations and/or a predicted amount of power that its associated low-level operation will consume in one or more future iterations. The future iteration(s) including the estimated and/or predicted amount(s) of power may include the immediately next iteration and/or one or more iterations of the low-level operation that may be performed subsequent to the immediately next iteration.

In some embodiments, one or more low-level operations may include a plurality of power consumption tables 506 in which each power consumption table 506 stores different data related to a particular low-level operation. For example, one or more low-level operations may include a different power consumption table 506 for storing the amount of power consumed by each iteration of the low-level operation and/or a different power consumption table 506 for the average amount of power consumed by the low-level operation in two or more previous iterations, the median amount of power consumed by the low-level operation in two or more previous iterations, the mode of the amount of power consumed by the low-level operation in two or more previous iterations, the estimated amount(s) of power for the future iteration(s), and/or the predicted amount(s) of power for the future iteration(s) or the like, among other suitable amounts of consumed power that are possible and contemplated herein.

The power consumption table(s) 506 that may store the average, median, and/or mode for one or more low-level operations, in some embodiments, may further store one or more additional averages, medians, and/or modes for the low-level operation(s). The average(s), median(s), and/or mode(s) for the low-level operation(s) may be the calculated average, median, and/or mode over time, which may include any suitable quantity of time taken over a continuous period of time or over two or more discontinuous periods of time. In various embodiments, an estimated and/or predicted amount of power that one or more low-level operations will consume in a future iteration may be based on the calculated average(s), the median(s), or the mode(s).

A sequencer circuit 508 may include any suitable hardware and/or software that may perform input/output (I/O) operations on a memory device. In various embodiments, the sequencer circuit 508 may perform low-level operations on a memory device based on the amount(s) of power stored in the power consumption table(s) 506. Example low-level operations include, but are not limited to, issuing commands to a memory device (e.g., a write-in-place memory device, a NAND memory device, or the like (see e.g., memory device(s) 802 in FIGS. 8A and 8B), issuing addresses to the memory device, issuing parametric data to the memory device, collecting status data from the memory device, and/or transferring data to/from the memory device (e.g., write operations, sense operations (e.g., read operations, program verify operation, or the like), block erase operations, or the like), among other low-level operations that are possible and contemplated herein.

In some embodiments, a sequencer circuit 508 may utilize a power consumption table 506 to lookup, predict, and/or determine the amount of power to utilize when performing the next iteration of one or more low-level operations. That is, the sequencer circuit 508 may be considered, include, and/or be included as at least a portion of an adjustable and/or adaptable power balancing mechanism.

In various embodiments, the amount of power utilized for the next iteration of a low-level operation may be based on the amount(s) of power consumed by the low-level operation in one or more previous iterations of the low-level operation. In some embodiments, the amount of power utilized for the next iteration of a low-level operation may be the amount of power consumed in the immediately preceding iteration or a previous iteration occurring prior to the immediately preceding iteration, as discussed elsewhere herein. In additional or alternative embodiments, the amount of power utilized for the next iteration of a low-level operation may be based on the average, median, or mode amount of power utilized by the low-level operation calculated over one or more continuous or discontinuous periods of time and/or quantities of iterations and/or various combinations of one or more averages, one or more medians, and/or one or more modes, as discussed elsewhere herein. In still further additional or alternative embodiments, the amount of power utilized for the next iteration of a low-level operation may be an estimated and/or predicted amount of power that a low-level operation will consume in the next iteration, as discussed elsewhere herein. In yet further additional or alternative embodiments, the amount of power utilized for the next iteration of a low-level operation may change over time based on the expiration of one or more predetermined amounts of time and/or the performance of one or more predetermined quantities of iterations for a low-level operation, as discussed elsewhere herein.

A sequencer circuit 508, in various embodiments, may utilize the same amount of power for each of a plurality of low-level operations performed on a memory device and/or utilize different amounts of power for at least two different low-level operations performed on a memory device. In some embodiments, a sequencer circuit 508 may use different amounts of power for each of a plurality of low-level operations such that all of the low-level operations use a different amount of power in their respective next iterations.

In various embodiments, a sequencer circuit 508 may modify the amount of power to use in the next iteration based on the value(s) in the power consumption table(s) 506 for each low-level operation. For example, the sequencer circuit 508 may increase the amount of power used in the next iteration of a low-level operation in response to the actual amount of power consumed in the previous iteration of the low-level operation being greater than the amount of power allocated for use in performing the previous iteration. Alternatively, the sequencer circuit 508 may decrease the amount of power used in the next iteration of a low-level operation in response to the actual amount of power consumed in the previous iteration of the low-level operation being less than the amount of power allocated for use in performing the previous iteration.

Further, a sequencer circuit 508 may use the same amount of power in the next iteration that was used in the previous iteration based on the value(s) in the power consumption table(s) 506 for each low-level operation. For example, the sequencer circuit 508 may maintain the same amount of power used in the next iteration of a low-level operation in response to the actual amount of power consumed in the previous iteration of the low-level operation being within a predetermined threshold difference and/or equal to the amount of power allocated for use in performing the previous iteration.

In some embodiments, a sequencer circuit 508 may determine whether the determined amount of power for use in the next iteration of a low-level operation is greater than a predetermined maximum allowed amount of power. In response to the determined amount of power being greater than or equal to the maximum allowed amount of power, the sequencer circuit 508 may utilize the maximum allowed amount of power to perform the next iteration of the low-level operation. In some embodiments, in response to the determined amount of power being greater than or equal to the maximum allowed amount of power, the sequencer circuit 508 may default to utilizing the maximum allowed amount of power to perform each iteration of the low-level operation thereafter. In response to the determined amount of power being less than the maximum allowed amount of power, the sequencer circuit 508 may utilize the determined amount of power to perform the next iteration of the low-level operation.

In some embodiments, a sequencer circuit 508 may record and/or write the amount of power allocated to and/or used in performing one or more low-level operations to one or more power consumption tables 506. In additional or alternative embodiments, a sequencer circuit 508 may record and/or write the predicted amount of power allocated to and/or used in performing one or more low-level operations to one or more power consumption tables 506.

A memory device interface (I/F) 510 may include any suitable hardware and/or software that may allow communication between PBC 500 and a memory device (see e.g., memory device 802 in FIGS. 8A and 8B). In some embodiments, a memory device IF 510 may include a Common Flash Memory Interface (CMI), among other interfaces that are possible and contemplated herein.

Figure 7A:
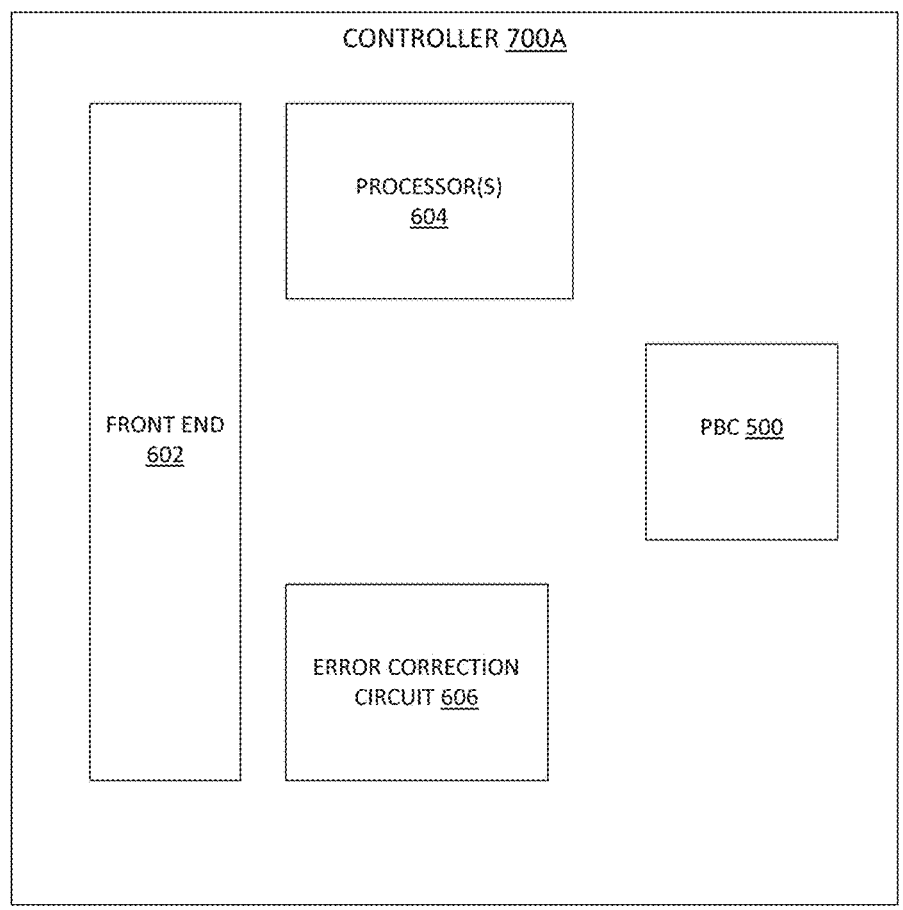
FIGS. 7A and 7B are a schematic block diagrams illustrating various embodiments of a controller including one or more PBCs.
Figure 7B:
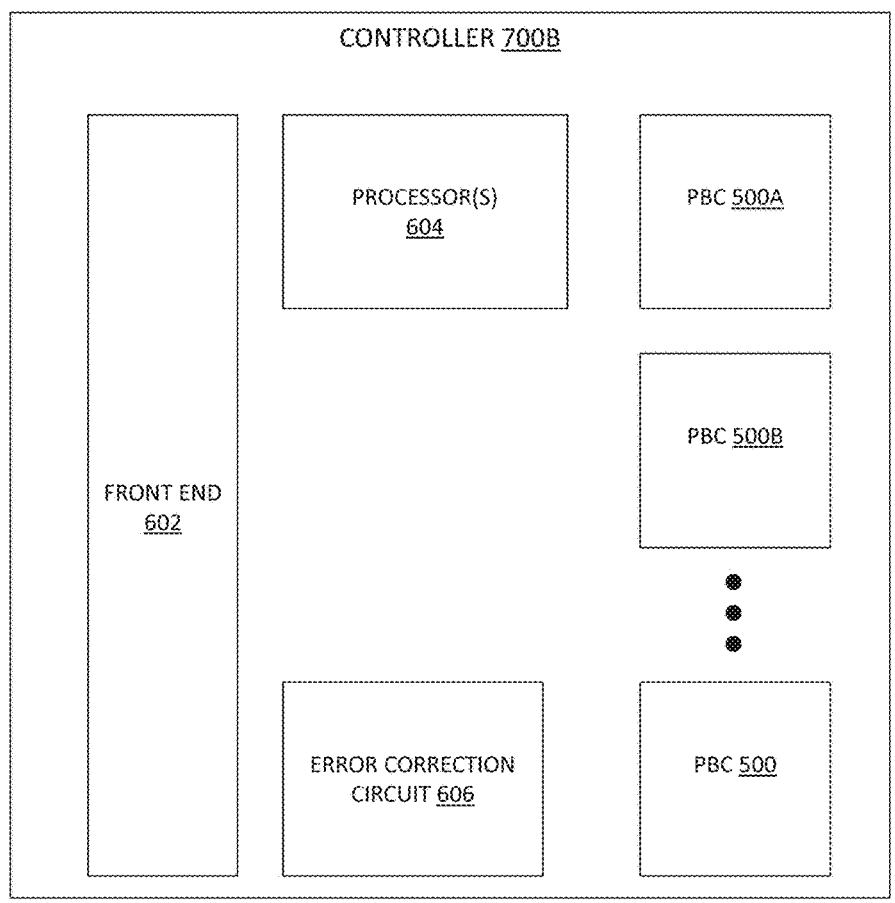

Referring to FIGS. 7A and 7B, FIGS. 7A and 7B are a schematic block diagrams illustrating various embodiments of a controller 700A and 700B (also simply referred to individually, in various groups, or collectively, as controller(s) 700), which may be similar to controller 126 in FIG. 1A and/or controller 244 in FIG. 1B. A controller 700 may include any suitable hardware and/or software that is known or developed in the future that may receive I/O requests (e.g., write requests, read requests, or the like). Further, the controller 700 may, in response to an I/O request, issue and/or generate a corresponding I/O command (e.g., a write command, read command, or the like).

At least in the embodiment illustrated in FIG. 7A, a controller 700A includes, among other components, a PCB 500 similar to the various embodiments discussed elsewhere herein, a front-end circuit 702, an error correction circuit 704, and one or more processors 706. A front-end circuit 702 may include any type of front-end circuit that is known or developed in the future. In various embodiments, a front-end circuit 702 may include any suitable hardware and/or software that may allow and/or facilitate communication between a controller 700 and a host computing device (see e.g., host computing device 804 in FIGS. 8A and 8B).

An error correction circuit 704 may include any type of error correction circuit that is known or developed in the future. In various embodiments, an error correction circuit 704 may include any suitable hardware and/or software that may determine and/or detect one or more errors in one or more memory devices (see e.g., memory device(s) 802 in FIGS. 8A and 8B). The error(s) may include hardware and/or software errors related to I/O operations and/or the physical ability of a memory device to store and/or retrieve data.

A processor 706 may include any suitable hardware and/or software that may perform or at least facilitate performance of the operations of PCB 500, front-end circuit 702, and error correction circuit 704. In some embodiments, controller 700A includes one processor 706 and in other embodiments includes two or more processors 706 to perform or at least facilitate performance of the operations of PCB 500, front-end circuit 702, and error correction circuit 704.

In the embodiment illustrated in FIG. 7B, a controller 700B includes, among other components, a plurality of PCBs 500A, 500B, . . . 500n similar to the various embodiments discussed elsewhere herein. In addition, the controller 700B includes a front-end circuit 702, an error correction circuit 704, and one or more processors 706, similar to the various embodiments discussed elsewhere herein.

With to FIGS. 8A and 8B, FIGS. 8A and 8B are a schematic block diagrams illustrating various embodiments of a storage system 800A and 800B (also simply referred to individually, in various groups, or collectively, as storage system(s) 800), which may be similar to system 100 in FIG. 1A. At least in the embodiment illustrated in FIG. 8A, a storage system 800A includes, among other components, a controller 700A similar to the various embodiments discussed elsewhere herein, a memory device 802, and a host computing device 804.

A memory device 802 may be any suitable hardware and/or software including a memory block and/or memory cell that is known or developed in the future that may store computer-usable data and/or code. A memory device 802 may include and/or be similar to the memory device 120 in FIG. 1A and/or the non-volatile storage device 210 in FIG. 1B.

In various embodiments, a memory device 802 may include a write-in-place memory device and/or a NAND memory device. Further, the memory device 802 may include a single-level cell (SLC) device, a two-level cell (MLC), a three-level cell (TLC), or a quad-level (QLC) device, among other types of memory devices that are possible and contemplated herein.

A host computing device 804 may include any type of computing device that is known or developed in the future. A host computing device 804, may include any suitable hardware and/or software that may transmit I/O commands to a controller 700, which in response to, controller 700 performs suitable corresponding I/O operations on the memory device(s) 802. For example, a host computing device 804 may transmit commands (e.g., commands for low-level operations) to the controller 700 and, in response thereto, the controller 700 may perform corresponding low-level operations on one or more memory devices 802.

In FIG. 8B, a storage system 800A includes, among other components, a controller 700B, memory devices 802A, 802B, . . . and 802n (also simply referred to individually, in various groups, or collectively, as memory device(s) 802), and a host computing device 804 similar to the various embodiments discussed elsewhere herein. At least in the illustrated embodiment, the controller 700B includes PBCs 500A, 500B, . . . and 500n (also simply referred to individually, in various groups, or collectively, as PBC(s) 500), among other quantities that are possible and contemplated herein.

In various embodiments, each PBC 500 may be associated and/or paired with a respective memory device 802. That is, each PBC 500 is coupled to and/or in communication with a respective memory device 802. As illustrated in FIG. 8B, PBC 500A is coupled to and/or in communication with memory device 802A, PBC 500B is coupled to and/or in communication with memory device 802B, . . . and PBC 500n is coupled to and/or in communication with memory device 802n, among other paired quantities that are possible and contemplated herein.

While FIGS. 7B and 8B illustrate and discuss a set of PBCs 500 including three PBCs 500 (e.g., PBCs 500A, 500B, . . . and 500n), the various embodiments illustrated and/or discussed herein are not limited to three PBCs 500. That is, the scope and/or spirit of the various embodiments may include one PBC 500 (see e.g., FIGS. 7A and 8A), two PBCs 500, and/or any quantity of PBCs 500 greater than or equal to four PBCs 500.

Similarly, while FIGS. 7B and 8B illustrate and discuss a set of memory devices 802 including three memory devices 802 (e.g., memory devices 802A, 802B, . . . and 802n), the various embodiments illustrated and/or discussed herein are not limited to three memory devices 802. That is, the scope and/or spirit of the various embodiments may include one memory device 802 (see e.g., FIGS. 7A and 8A), two memory devices 802, and/or any quantity of memory devices 802 greater than or equal to four memory devices 802.

Furthermore, while FIGS. 7B and 8B illustrate and discuss a set of paired PBCs 500 and memory devices 802 including three pairs of PBCs 500 and memory devices 802 (e.g., PBC 500A/memory device 802A, PBC 500B/memory device 802B, . . . and PBC 500n/memory device 802n), the various embodiments illustrated and/or discussed herein are not limited to three pairs of PBCs 500 and memory devices 802. That is, the scope and/or spirit of the various embodiments may include one PBC 500/memory device 802 pair (see e.g., FIGS. 7A and 8A), two PBC 500/memory device 802 pairs, and/or any quantity of PBC 500/memory device 802 pairs greater than or equal to four PBC 500/memory device 802 pairs.

Figure 9:
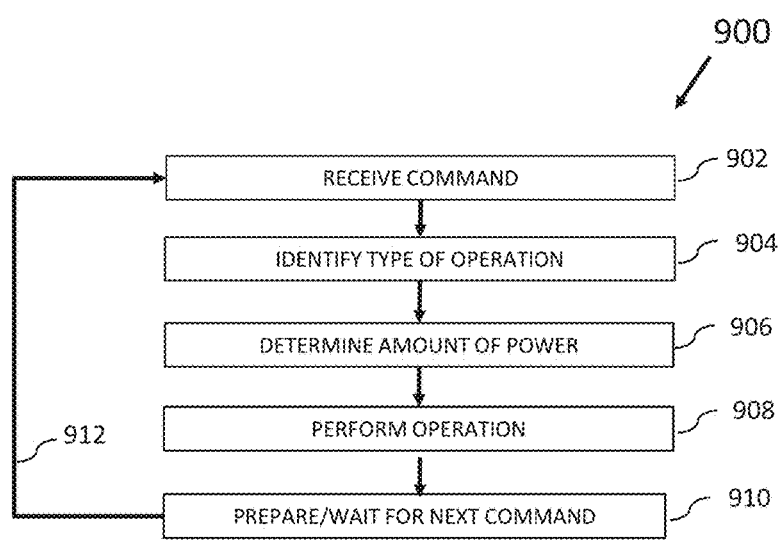
FIG. 9 is a schematic flow chart diagram illustrating one embodiment of a method for adaptive power balancing in memory device operations.

FIG. 9 is a schematic flow chart diagram illustrating one embodiment of a method 900 for adaptive power balancing in memory device operations (e.g., low-level operations). At least in the illustrated embodiment, the method 900 begins by a controller (e.g., controller 126, 244, 700, 700A, and 700B, or the like) receiving a command from a host computing device (e.g., host computing device 804) to perform one or more low-level operations on a memory device (e.g., memory device 120, 210, 802, 802A, 802B, 802n, or the like) (block 902). In some embodiment, the received command is split into a plurality of low-level operations that are performed on the memory device. The low-level operation(s) may be any of the low-level operations discussed elsewhere herein.

In response to the command, the controller identifies each type of low-level operation (block 904) and determines the amount of power to provide and/or allocate for performing the low-level operation(s) (block 906). The determined amount of power provided and/or allocated is based on the particular low-operation(s). Further, the determined amount of power provided and/or allocated, in various embodiments, may be determined, looked up, estimated, and/or predicted based on the amount of power consumed in one or more previous iterations of each low-operation, as discussed elsewhere herein.

The controller may perform the low-level operation(s) on the memory device using the determined amount of power (block 908). The controller may prepare for and/or wait to receive a subsequent command from the host computing device (block 910), upon receipt of such, blocks 902 through 910 may then be repeated (return 912).

Figure 10:
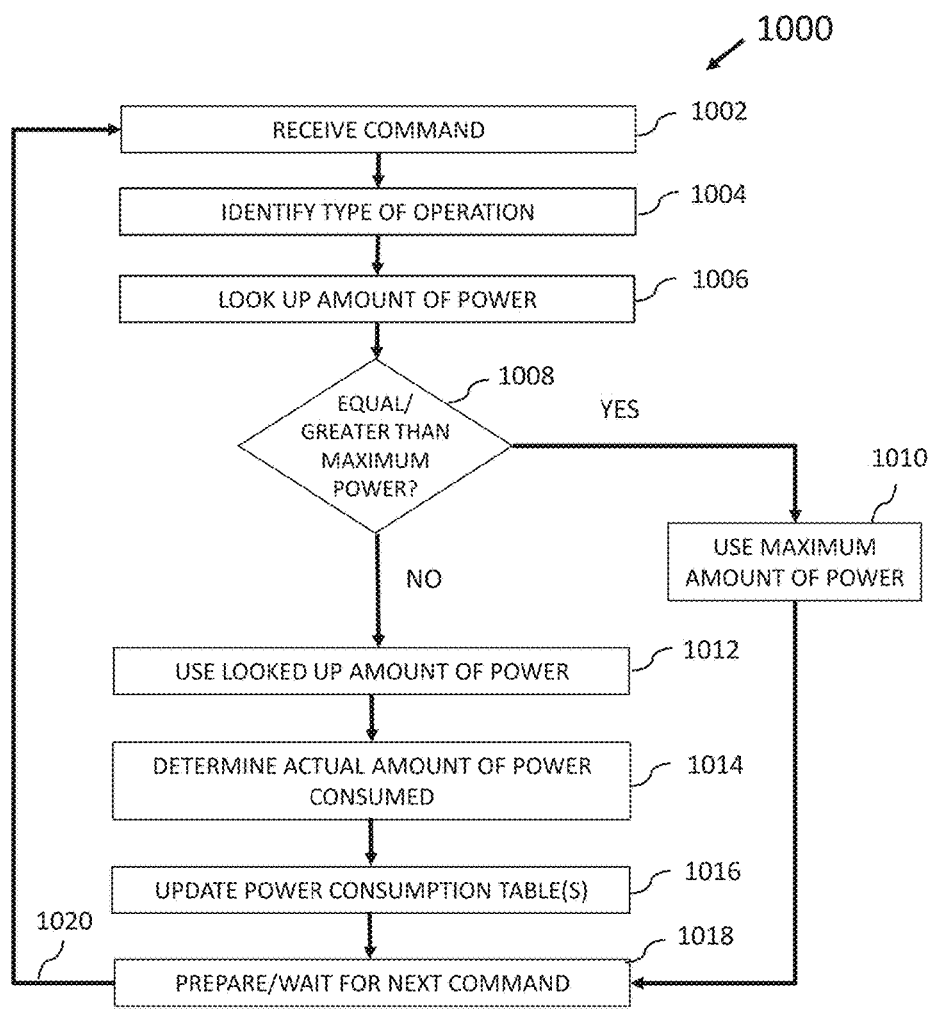
FIG. 10 is a schematic flow chart diagram illustrating another embodiment of a method for adaptive power balancing in memory device operations.

FIG. 10 is a schematic flow chart diagram illustrating another embodiment of a method 1000 for adaptive power balancing in memory device operations (e.g., low-level operations). At least in the illustrated embodiment, the method 1000 begins by a controller (e.g., controller 126, 244, 700, 700A, and 700B, or the like) receiving a command from a host computing device (e.g., host computing device 804) to perform one or more low-level operations on a memory device (e.g., memory device 120, 210, 802, 802A, 802B, 802*n*, or the like) (block 1002). In some embodiment, the received command is split into a plurality of low-level operations that are performed on the memory device. The low-level operation(s) may be any of the low-level operations discussed elsewhere herein.

In response to the command, the controller identifies each type of low-level operation (block 1004) and looks up, in one or more power consumption tables (e.g., the power consumption table(s) 506, the amount of power to provide and/or allocate for performing the low-level operation(s) (block 1006). The one or more power consumption tables may store the value(s) representing the amount of power consumed by the low-level operation(s) in one or more previous iterations of each low-level operation, as discussed elsewhere herein. For example, the amount of power looked up may include the actual amount of power consumed in the one or more previous iterations (e.g., the immediately preceding iteration), one or more average amounts of power, one or more median amounts of power, and/or one or more mode amounts of power, or the like, as discussed elsewhere herein.

The controller may then compare the looked up amount of power to a predetermined maximum amount of allowed power to determine if the looked up amount of power is greater than or equal to the maximum amount of allowed power (block 1008). In response to the looked up amount of power being greater than or equal to the maximum amount of allowed power (e.g., a "YES" in block 1008), the controller uses the maximum amount of power to perform the low-level operation(s) (block 1010) and may prepare for and/or wait to receive a subsequent command from the host computing device (block 1018). Alternatively or additionally, some embodiments provide that the controller may delay performing the low-level operation(s) in block 1010 until additional amounts of power are allocated beyond the maximum amount and use the additional amount of power to perform the low-level operation(s). In response to the looked up amount of power being less than the maximum amount of allowed power (e.g., a "NO" in block 1008), the controller uses the looked up amount of power to perform the low-level operation (block 1012).

Subsequent to performing the low-level operation, the controller may determine the actual amount of power that the low-level operation(s) consumed during performance of the low-level operation(s) (block 1014) and update the power consumption table(s) (block 1016). The power consumption table(s) may be updated to include the actual amount of power consumed in this iteration, calculate/include one or more new averages, calculate/include one or more new medians, and/or calculate/include one or more new modes, or the like, among other data may update the power consumption table(s) that are possible and contemplated herein. The controller may then prepare for and/or wait to receive a subsequent command from the host computing device (block 1018), upon receipt of such, blocks 1002 through 1018 may then be repeated (return 1020).

Figure 11:
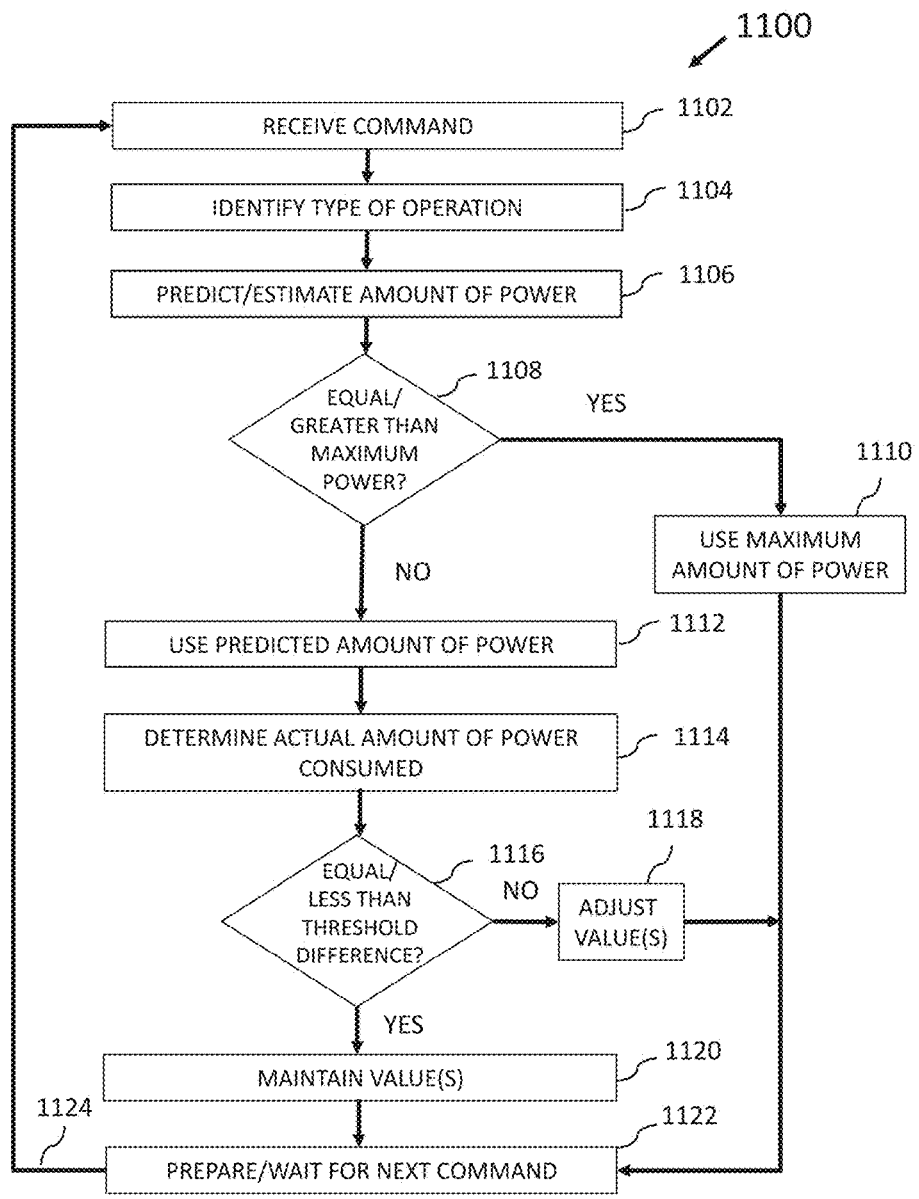
FIG. 11 is a schematic flow chart diagram illustrating yet another embodiment of a method for adaptive power balancing in memory device operations.

FIG. 11 is a schematic flow chart diagram illustrating yet another embodiment of a method 1100 for adaptive power balancing in memory device operations (e.g., low-level operations). At least in the illustrated embodiment, the method 1100 begins by a controller (e.g., controller 126, 244, 700, 700A, and 700B, or the like) receiving a command from a host computing device (e.g., host computing device 804) to perform one or more low-level operations on a memory device (e.g., memory device 120, 210, 802, 802A, 802B, 802*n*, or the like) (block 1102). In some embodiment, the received command is split into a plurality of low-level operations that are performed on the memory device. The low-level operation(s) may be any of the low-level operations discussed elsewhere herein.

In response to the command, the controller identifies each type of low-level operation (block 1104) and predicts and/or estimates the amount of power to provide and/or allocate for performing the low-level operation(s) (block 1106). The predicted amount of power may be based on one or more values stored in one or more power consumption tables and/or be the result of a trend analysis of a plurality of amounts of power consumed by the low-level operation(s) over time, which may be time based and/or based on the quantity of iterations performed (e.g., the actual amount of power consumed executing an operation may change over time, a power budget may be adjusted and/or otherwise changed over time, or the like, due to age, wear, disturb effects, environmental factors, or the like). The value(s) may represent the amount of power consumed by the low-level operation(s) in one or more previous iterations of the low-level operation, as discussed elsewhere herein. For example, the amount(s) of power may include the actual amount(s) of power consumed in the one or more previous iterations (e.g., the immediately preceding iteration and/or a trend), one or more average amounts of power, one or more median amounts of power, and/or one or more mode amounts of power, or the like, as discussed elsewhere herein.

The controller may then compare the predicted amount of power to a predetermined maximum amount of allowed power (e.g., a power budget) to determine if the predicted amount of power is greater than the maximum amount of allowed power (block 1108), or otherwise fails to satisfy the maximum amount of allowed power. In response to the predicted amount of power failing to satisfy (e.g., being greater than, being greater than or equal to, or the like) the maximum amount of allowed power (e.g., a "YES" in block 1108), the controller may delay execution of the operation until the predicted amount of power is less than or equal to the maximum amount of allowed power, may use the maximum amount of power to perform the low-level operation, or the like (block 1110) and may prepare for and/or wait to receive a subsequent command from the host computing device (block 1122), upon receipt of such, blocks 1102 through 1122 may then be repeated (return 1124).

In response to the predicted amount of power satisfying (e.g., being less than, being less than or equal to, or the like) the maximum amount of allowed power (e.g., a "NO" in block 1108), the controller uses the predicted amount of power to perform the low-level operation(s) (block 1112), without artificially delaying execution of the low-level operation(s), or the like. Subsequent to performing the low-level operation(s), the controller may determine the actual amount of power that the low-level operation(s) consumed during performance of the low-level operation (block 1114) and compare the predicted amount of power and the actual amount of power consumed to determine whether the predicted amount of power is less than or equal to a predetermined threshold difference (block 1116), which may be any suitable threshold value or amount. In response to the predicted amount of power being greater than the predetermined threshold difference (e.g., a "NO" in block 1116), the controller may adjust the value(s) in the power consumption table(s) upon which the prediction was made (block 1118). The controller may then prepare for and/or wait to receive a subsequent command from the host computing device (block 1122), upon receipt of such, blocks 1102 through 1122 may then be repeated (return 1124).

In response to the predicted amount of power being less than or equal to the predetermined threshold difference (e.g., a "YES" in block 1116), the controller may maintain the value(s) in the power consumption table(s) upon which the prediction was made and/or add the predicted value to the power consumption table(s) (block 1120). The controller may then prepare for and/or wait to receive a subsequent command from the host computing device (block 1122), upon receipt of such, blocks 1102 through 1122 may then be repeated (return 1124).

Figure 12:
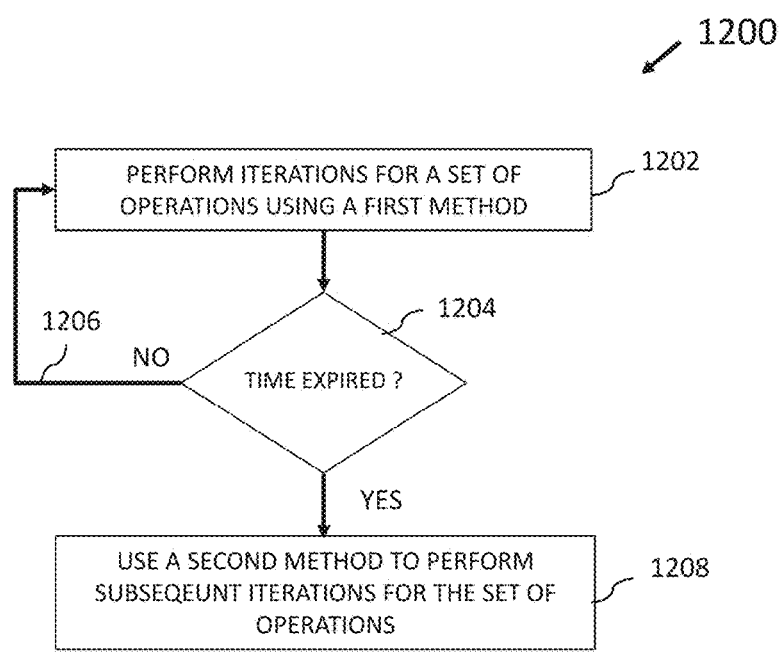
FIG. 12 is a schematic flow chart diagram illustrating an alternative embodiment of a method for adaptive power balancing in memory device operations.

FIG. 12 is a schematic flow chart diagram illustrating an alternative embodiment of a method 1200 for adaptive power balancing in memory device operations (e.g., low-level operations). At least in the illustrated embodiment, method 1200 begins by a controller (e.g., controller 126, 244, 700, 700A, and 700B, or the like) performing a low-level operation on a memory device (e.g., memory device 120, 210, 802, 802A, 802B, 802n, or the like) using a first method (e.g., one of the techniques/calculations in method 1000 or method 1100) (block 1202). The low-level operation may be any of the low-level operations discussed elsewhere herein.

The controller, at one or more points in time, may determine whether a predetermined amount of time has expired since the controller first began performing iterations of the low-level operation (block 1204). In response to the predetermined amount of time having not expired (e.g., a "NO" in block 1204), the controller continues performing the low-level operation using the first method (return 1206).

In response to the expiration of the predetermined amount of time (e.g., a "YES" in block 1204), the controller begins performing the low-level operation using a second method (e.g., a different one of the techniques/calculations in method 1000 or method 1100) (block 1208). For example, the controller may use a technique in method 1000 that is based on the previous iteration(s) until the expiration of the predetermined amount and then switch to using the prediction technique of method 1100 thereafter or vice versa. In another non-limiting example, the controller may use a first technique in method 1000 that is based on the previous iteration(s) until the expiration of the predetermined amount and then switch to using a second technique in method 1000 that is based on the previous iteration(s).

Figure 13:
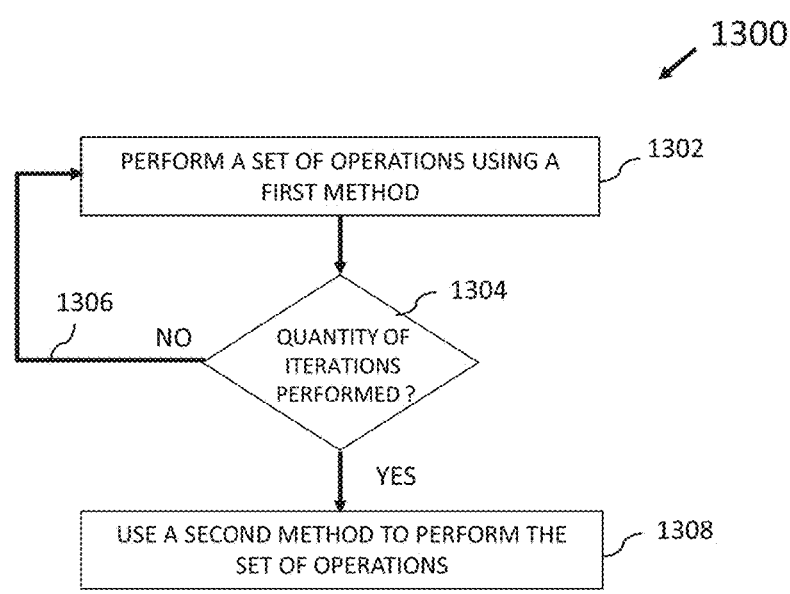
FIG. 13 is a schematic flow chart diagram illustrating another alternative embodiment of a method for adaptive power balancing in memory device operations.

FIG. 13 is a schematic flow chart diagram illustrating another alternative embodiment of a method 1300 for adaptive power balancing in memory device operations (e.g., low-level operations). At least in the illustrated embodiment, method 1300 begins by a controller (e.g., controller 126, 244, 700, 700A, and 700B, or the like) performing a low-level operation on a memory device (e.g., memory device 120, 210, 802, 802A, 802B, 802n, or the like) using a first method (e.g., one of the techniques/calculations in method 1000 or method 1100) (block 1302). The low-level operation may be any of the low-level operations discussed elsewhere herein.

The controller, at one or more points in time, may determine whether a predetermined quantity of iterations for the low-level operation has been performed since the controller first began performing iterations of the low-level operation (block 1304). In response to the controller not having performed the predetermined quantity of iterations (e.g., a "NO" in block 1304), the controller continues performing the low-level operation using the first method (return 1306).

In response to the controller having performed the predetermined quantity of iterations (e.g., a "YES" in block 1304), the controller begins performing the low-level operation using a second method (e.g., a different one of the techniques/calculations in method 1000 or method 1100) (block 1308). For example, the controller may use a technique in method 1000 that is based on the previous iteration(s) until the predetermined quantity of iterations have been performed and then switch to using the prediction technique of method 1100 thereafter or vice versa. In another non-limiting example, the controller may use a first technique in method 1000 that is based on the previous iteration(s) until the expiration of the predetermined amount and then switch to using a second technique in method 1000 that is based on the previous iteration(s).

Figure 14:
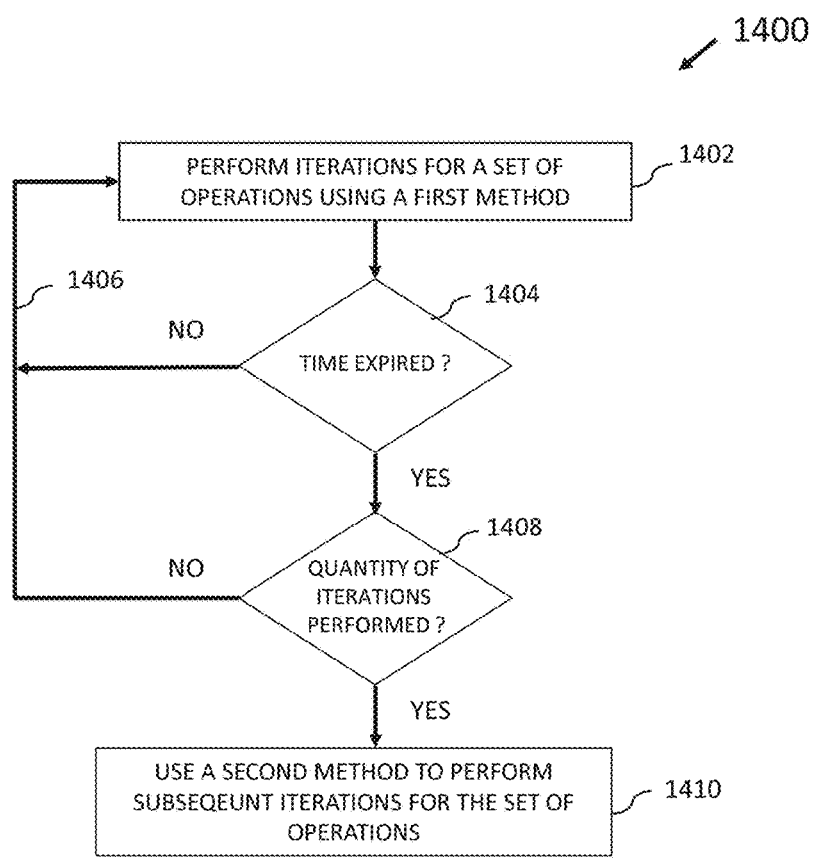
FIG. 14 is a schematic flow chart diagram illustrating a further alternative embodiment of a method for adaptive power balancing in memory device operations.

FIG. 14 is a schematic flow chart diagram illustrating a further alternative embodiment of a method 1400 for adaptive power balancing in memory device operations (e.g., low-level operations). At least in the illustrated embodiment, method 1400 begins by a controller (e.g., controller 126, 244, 700, 700A, and 700B, or the like) performing a low-level operation on a memory device (e.g., memory device 120, 210, 802, 802A, 802B, 802n, or the like) using a first method (e.g., one of the techniques/calculations in method 1000 or method 1100) (block 1202). The low-level operation may be any of the low-level operations discussed elsewhere herein.

The controller, at one or more points in time, may determine whether a predetermined amount of time has expired since the controller first began performing iterations of the low-level operation (block 1404). In response to the predetermined amount of time having not expired (e.g., a "NO" in block 1404), the controller continues performing the low-level operation using the first method (return 1406).

In response to the expiration of the predetermined amount of time (e.g., a "YES" in block 1404), the controller may determine whether a predetermined quantity of iterations for the low-level operation has been performed since the controller first began performing iterations of the low-level operation (block 1408). In response to the controller not having performed the predetermined quantity of iterations (e.g., a "NO" in block 1408), the controller continues performing the low-level operation using the first method (return 1406).

In response to the controller having performed the predetermined quantity of iterations (e.g., a "YES" in block 1408), the controller begins performing the low-level operation using a second method (e.g., a different one of the techniques/calculations in method 1000 or method 1100) (block 1410). For example, the controller may use a technique in method 1000 that is based on the previous iteration(s) until the predetermined quantity of iterations have been performed and then switch to using the prediction technique of method 1100 thereafter or vice versa. In another non-limiting example, the controller may use a first technique in method 1000 that is based on the previous iteration(s) until the expiration of the predetermined amount and then switch to using a second technique in method 1000 that is based on the previous iteration(s).

Figure 15:
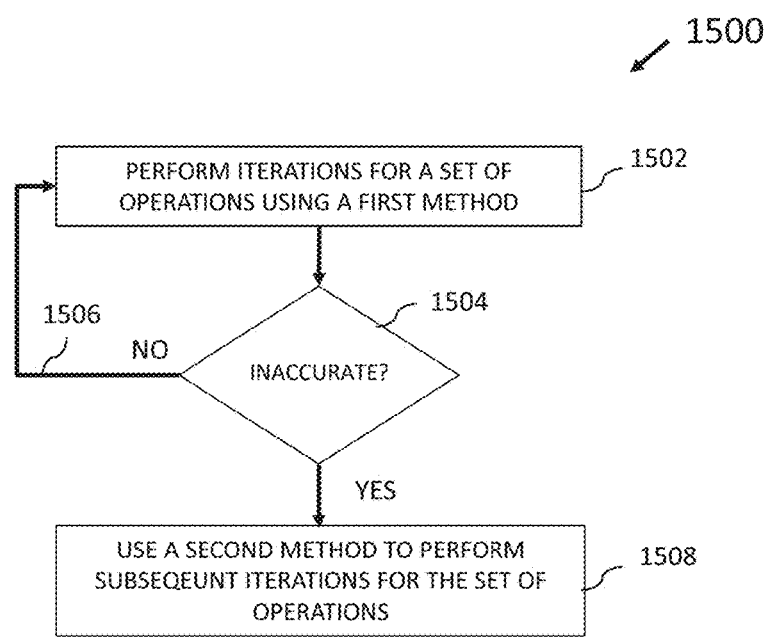
FIG. 15 is a schematic flow chart diagram illustrating yet another alternative embodiment of a method for adaptive power balancing in memory device operations.

FIG. 15 is a schematic flow chart diagram illustrating an alternative embodiment of a method 1500 for adaptive power balancing in memory device operations (e.g., low-level operations). At least in the illustrated embodiment, method 1500 begins by a controller (e.g., controller 126, 244, 700, 700A, and 700B, or the like) performing a low-level operation on a memory device (e.g., memory device 120, 210, 802, 802A, 802B, 802n, or the like) using a first method (e.g., one of the techniques/calculations in method 1000 or method 1100) (block 1502). The low-level operation may be any of the low-level operations discussed elsewhere herein.

The controller, at one or more points in time, determine whether a next predicted amount of power for performing a low-level operation is inaccurate (block 1504). In response to the determining that the predicted amount of power is accurate (e.g., a "NO" in block 1504), the controller continues performing the low-level operation using the first method (return 1506).

In response to determining that the predicted amount of power is inaccurate (e.g., a "YES" in block 1504), the controller begins performing the low-level operation using a second method (e.g., a different one of the techniques/calculations in method 1000 or method 1100) (block 1508). For example, the controller may use the prediction technique of method 1100 until it becomes inaccurate and then switch to using one of the techniques in method 1000.

A means for adaptive power balancing in memory device operations (e.g., low-level operations) by a PBC 150, in various embodiments, may include one or more of a PBC 150, a power consumption monitoring circuit 502, a power calculation circuit 504, one or more power consumption tables 506, a sequencer circuit 508, a memory device I/F 510, a non-volatile memory device 120, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for adaptive power balancing in memory device operations by a PBC 150.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a memory device; and
   a power balancing component for the memory device, the power balancing component configured to:
      measure, using a power consumption monitoring circuit, a first amount of power actually consumed by each respective operation in a set of operations for the memory device for at least one previous iteration of each respective operation, and
      utilize a second amount of power to perform a next iteration of each respective operation based on the first amount of power actually consumed by each respective operation in the at least one previous iteration,
   wherein the at least one previous iteration comprises an immediately preceding iteration.

2. The apparatus of claim 1, wherein the power balancing component is further configured to:
   determine a third amount of power utilized to perform the at least one previous iteration of each respective operation; and
   compare the third amount of power and the first amount of power,
   wherein:
      the third amount of power and the second amount of power are equal amounts of power in response to the third amount of power being equal to the first amount of power, and
      the second amount of power is greater than the third amount of power in response to the third amount of power being less than the first amount of power.

3. The apparatus of claim 1, wherein the power balancing component is further configured to:
   monitor each respective operation over a predetermined amount of time including at least two previous iterations of each respective operation;
   track the first amount of power consumed by each respective operation during the predetermined amount of time;
   calculate an average first amount of power consumed by the at least two previous iterations of each respective operation during the predetermined amount of time; and
   set the second amount of power equal to the average first amount of power.

4. The apparatus of claim 1, wherein the power balancing component is further configured to track a plurality of the first amounts of power consumed by each respective operation over a predetermined amount of time including a plurality of previous iterations of each respective operation.

5. The apparatus of claim 4, wherein the power balancing component is further configured to generate a predicted first amount of power that will be consumed by each respective operation in the next iteration of each respective operation based on the tracked first amount of power.

6. The apparatus of claim 5, wherein the power balancing component is further configured to set the second amount of power equal to the predicted first amount of power.

7. The apparatus of claim 1, wherein the set of operations comprises a plurality of different operations.

8. The apparatus of claim 1, wherein the memory device comprises at least one integrated circuit memory die comprising an array of non-volatile memory cells and the power balancing component comprises the power consumption monitoring circuit, wherein the power consumption monitoring circuit is disposed on the memory die and configured to measure electrical power consumed by the array of non-volatile memory cells on the memory die.

9. The apparatus of claim 1, wherein the power balancing component is configured to utilize the second amount of power to perform the next iteration of each respective operation by delaying execution of one or more operations of the next iteration of each respective operation to fit within a power budget for the memory device.

10. A method, comprising:
determining, by a controller based on measurements of power consumption monitoring circuits of each memory device in a set of one or more memory devices, a first amount of power actually consumed by each respective operation in a set of operations for each memory device in the set of one or more memory devices for at least one previous iteration of each respective operation; and
utilizing a second amount of power to perform a next iteration of each respective operation based on the first amount of power actually consumed by each respective operation in the at least one previous iteration,
wherein the at least one previous iteration comprises an immediately preceding iteration.

11. The method of claim 10, further comprising:
determining a third amount of power utilized to perform the at least one previous iteration of each respective operation; and
compare the third amount of power and the first amount of power, wherein:
the third amount of power and the second amount of power are equal amounts of power in response to the third amount of power being equal to the first amount of power, and
the second amount of power is greater than the third amount of power in response to the third amount of power being less than the first amount of power.

12. The method of claim 10, further comprising:
tracking the first amount of power consumed by each respective operation over respective predetermined amounts of time including at least two previous iterations of each respective operation;
calculating an average first amount of power consumed by the at least two previous iterations of each respective operation during the respective predetermined amounts of time; and
setting a respective second amount of power equal to the average first amount of power for each respective operation.

13. The method of claim 10, further comprising:
tracking a plurality of the first amounts of power consumed by each respective operation over respective predetermined amounts of time including a plurality of previous iterations of each respective operation;
generating a predicted first amount of power that will be consumed by each respective operation in the next iteration of each respective operation based on the tracked first amount of power; and
setting a respective second amount of power equal to the predicted first amount of power for each respective operation.

14. The method of claim 10, wherein:
a first set of operations for a first memory device in the set of one or more memory devices comprises a plurality of different operations; and
a second set of operations for a second memory device in the set of one or more memory devices includes a single operation.

15. The method of claim 10, wherein the set of operations comprises a plurality of different operations.

16. The method of claim 10, wherein the set of one or more memory devices comprises a plurality of memory devices.

17. The method of claim 16, wherein each of the plurality of memory devices comprises at least one integrated circuit memory die comprising an array of non-volatile memory cells and at least one of the power consumption monitoring circuits and the at least one of the power consumption monitoring circuits is configured to measure electrical power consumed by the array of non-volatile memory cells.

18. The method of claim 10, wherein the set of memory devices comprises a single memory device.

19. An apparatus comprising:
a plurality of memory elements;
means for monitoring measured amounts of electrical power actually used for execution of each of a plurality of operations on different memory elements of the plurality of memory elements; and
means for adjusting subsequent execution of one or more operations of the plurality of operations based on the monitored amounts of electrical power to fit within power budgets for different memory elements of the plurality of memory elements,
wherein the monitored measured amounts of electrical power actually used include an amount of electrical power actually used in an immediately preceding iteration for the plurality of operations.

20. The apparatus of claim 19, wherein each of the plurality of memory elements comprises at least one integrated circuit memory die comprising an array of non-volatile memory cells and the means for monitoring amounts of electrical power, at least one of the amounts of electric power being consumed by the array of non-volatile memory cells for executing at least one operation of the plurality of operations.

* * * * *